(12) United States Patent
Ooishi

(10) Patent No.: US 6,873,561 B2
(45) Date of Patent: Mar. 29, 2005

(54) SEMICONDUCTOR MEMORY DEVICE OPERATING WITH LOW CURRENT CONSUMPTION

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 34 days.

(21) Appl. No.: 10/409,120

(22) Filed: Apr. 9, 2003

(65) Prior Publication Data

US 2004/0027907 A1 Feb. 12, 2004

(30) Foreign Application Priority Data

Aug. 12, 2002 (JP) ........................................ 2002-234814

(51) Int. Cl.⁷ ................................................ G11C 7/00
(52) U.S. Cl. ........................ 365/226; 365/148; 365/158; 365/230.06
(58) Field of Search ........................... 365/226, 230.06, 365/148, 158

(56) References Cited

U.S. PATENT DOCUMENTS 6,088,267 A * 7/2000 Atsumi et al. ......... 365/185.23
6,297,686 B1    10/2001 Lin et al.
6,414,890 B2 *  7/2002 Arimoto et al. ........ 365/230.06
6,545,931 B2 *  4/2003 Hidaka ........................ 365/226
2003/0081453 A1 * 5/2003 Hidaka ........................ 365/158

FOREIGN PATENT DOCUMENTS

JP          2002-093146 A       3/2002

OTHER PUBLICATIONS

Stefan K. Lai, "Forefront of Non–Volatile Memory—The Future In Intel's Mind: From Flash Memory to OUM", Nikkei Microdevices, Mar. 2002, pp. 65–78.

* cited by examiner

Primary Examiner—Huan Hoang
(74) Attorney, Agent, or Firm—Burns, Doane, Swecker & Mathis, L.L.P.

(57) ABSTRACT

In a resistance value variable memory, substrate voltages and/or substrate biases of a digit line drive circuit, a word line drive circuit and a bit line drive circuit for a memory cell array are changed in accordance with an operation mode. A driving power on signal lines connected to memory cells can be increased, and a leakage current during standby can be reduced without increasing a circuit layout area.

19 Claims, 19 Drawing Sheets

FIG. 1
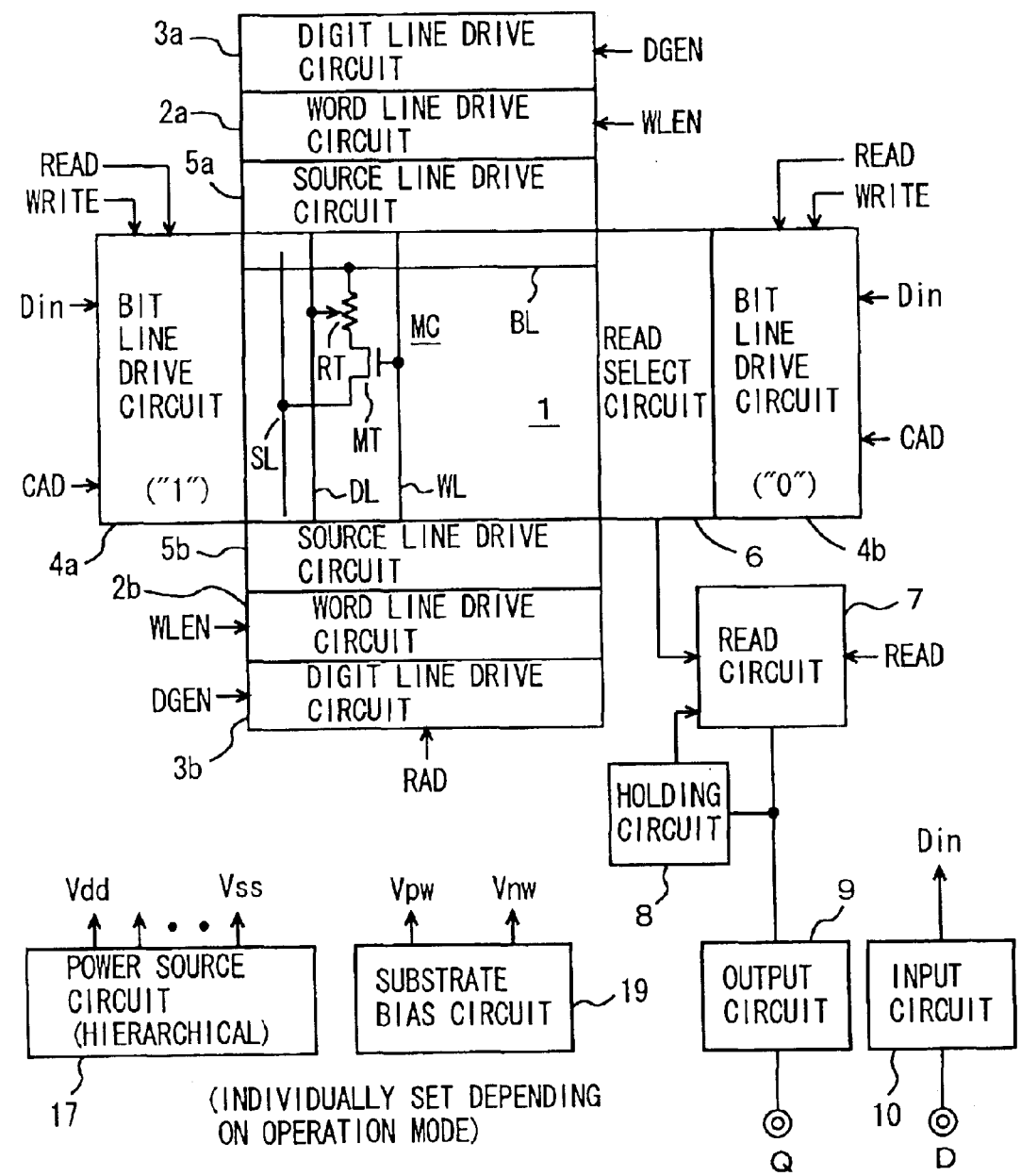
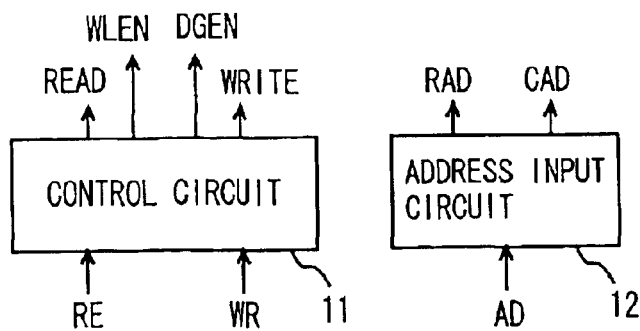

SEMICONDUCTOR MEMORY DEVICE OPERATING WITH LOW CURRENT CONSUMPTION

BACKGROUND OF THE INVENTION

1. Field of the Invention

The present invention generally relates to a semiconductor memory device, and particularly to a nonvolatile semiconductor memory device, in which memory cells include resistance elements having resistance values varying in accordance with storage data. More particularly, the invention relates to a structure for reducing a current consumption of a semiconductor device, particularly a nonvolatile semiconductor memory device.

2. Description of the Background Art

Such a memory device is known that a variable resistance element is utilized in a memory cell, and data is nonvolatilely stored by a resistance value of this variable resistance element. A phase change memory and a Magnetic Random Access Memory (MRAM) are known as the memory of such type.

In the phase change memory, a material such as polycrystalline silicon is set to an amorphous state or a crystalline state in accordance with data to be stored. Since the amorphous state and the crystalline state provide different resistance values, binary data can be stored.

The MRAM is a general name of solid state memories, which utilize a magnetization direction of a ferromagnet for data storage. In MRAM, the magnetization direction of the ferromagnetic substance forming a memory cell is set parallel and anti-parallel to a certain reference direction in accordance with data "1" and "0", respectively. The MRAMs include a GMR (Giant Magneto-Resistance) element utilizing a GMR effect for reading storage information of the memory cell, and a TMR (Tunneling Magneto-Resistance) element utilizing a tunneling magneto-resistance effect for reading the storage data.

GMR element has a resistance changing rate ranging from 6 to 8%, and has a disadvantage that a sense current of the order of 10 mA is required in a data read operation. In contrast, the TMR element is formed of three layer films of ferromagnetic, insulating and ferromagnetic layers, and a current flows by tunneling through the insulating layer. This tunneling resistance value changes in proportion to a cosine of a relative angle between the ferromagnetic layers on the opposite sides relative to the insulating film. TMR element has a feature that the resistance changing rate is 25% or higher, and a sense current of as small as 10 $\mu$A can provide a sufficiently large read signal.

FIG. 20 schematically shows a sectional structure of a memory cell. In FIG. 20, the memory cell includes a data storing portion S. Data storing portion S is arranged corresponding to a crossing between a write word line WWL and a write bit line WBL, and includes ferromagnetic layers 901 and 903, a dielectric layer 902 arranged between ferromagnetic layers 901 and 903, and an anti-ferromagnetic layer 904 placed between ferromagnetic layer 903 and write bit line WBL. Ferromagnetic layer 903 and anti-ferromagnetic layer 904 form a fixed layer having a fixed magnetization direction. The magnetization direction of ferromagnetic layer 901 is set by a word line current Iwl flowing through write word line WWL and a bit line current Ibl flowing through write bit line WBL, so that the data is stored.

When word line current Iwl flows, a magnetic field Hwl is induced rotating clockwise with respect to a flowing direction of current Iwl. When current Ibl flows through write bit line WBL, a magnetic field Hbl is induced rotating clockwise in a plane perpendicular to a flowing direction of bit line current Ibl. Write word line WWL and write bit line WBL are arranged perpendicular to each other, and the magnetic fields Hwl and Hbl are likewise perpendicular to each other. A composite magnetic field formed of these magnetic fields Hwl and Hbl determines the magnetization direction of ferromagnetic layer 901, and data is stored. When ferromagnetic layer 901 serving as a record layer and anti-ferromagnetic layer 904 of the fixed layer have the same magnetization direction, the data storing portion S has a small electric resistance value. When ferromagnetic layers 901 and 903 have anti-parallel magnetization directions or opposite magnetization directions, the data storing portion S has a high electric resistance.

In a data reading operation, a tunnel current flows through dielectric layer 902 in the data storing portion S, and data is read by detecting an amount of this current. The current flowing through a memory cell is a tunnel current flowing through thin dielectric layer 902. A "magnetic-tunneling junction" is formed in the memory cell and the memory cell is also referred to as a MTJ memory cell.

In using the GMR element, a nonmagnetic electric conductor is used in place of the dielectric layer.

FIG. 21 schematically shows a general sectional structure of a memory cell.

In the memory cell structure shown in FIG. 21, the storing portion S is arranged between write bit line WBL and a cell node CN. Cell node CN is formed of an electrically conductive layer, and is electrically connected to an N-type impurity region IMPb formed at a surface of a P-type substrate region SUB. An N-type impurity region IMPa is formed being spaced from impurity region IMPb at the surface of substrate region SUB. A read word line RWL is formed above a surface of the substrate region between these impurity regions IMPa and IMPb. Impurity region IMPa is coupled to read bit line RBL via a contact. Write word line WWL is arranged between read bit line RBL and cell node CN.

In a data read operation, the magnetization direction of the storing portion S is determined by the composite magnetic field of magnetic fields that are induced by currents flowing through write bit line WBL and write word line WWL. Therefore, the magnetization direction of the record layer with respect to the fixed layer is determined by setting the direction of the current flowing through the write bit line in accordance with the storage data, and data is written.

In the data read operation, read word line RWL is set to a selected state to form a channel at the surface of substrate region SUB for electrically coupling impurity regions IMPa and IMPb. A current flows from write bit line WBL to read bit line RBL, and the data stored in the storing portion S is detected in accordance with an amount of the current.

FIG. 22 shows an electrically equivalent circuit of a memory cell MC. In FIG. 22, memory cell MC includes a variable resistance element 912 and an N-channel MOS transistor 910 connected in series between write and read bit lines WBL and RBL. Variable resistance element 912 has an end electrically connected to write bit line WBL, and is also electro-magnetically coupled to write word line WWL. N-channel MOS transistor (access transistor) 910 has an conduction terminal electrically connected to the other end of variable resistance element 912, the other conduction terminal electrically coupled to read bit line RBL, and a control gate electrically connected to read word line RWL.

In the data write operation, currents flow through write word line WWL and write bit line WBL to induce the magnetic fields, which in turn determine a magnetic polarization state of variable resistance element 912, and the resistance value of the variable resistance element is determined depending on the magnetic polarization state. In the data read operation, access transistor 910 is turned on, and the data is sensed in accordance with the magnitude of the currents flowing through write and read bit lines WBL and RBL.

In the structure having the variable resistance element (TMR element) and the access transistor connected in series, the current flowing through access transistor 910 is needed to detect in the data read operation. Therefore, if characteristics of the access transistors vary, read current differ among the access transistors, and noises caused by these variations cannot be neglected. For example, in the MOS transistor (insulated gate field effect transistor), an electric field drop between the source and drain amounts to 100 mV or more in 0.25 $\mu$m rule. Accordingly, if variations of 10% are present in the characteristics of the access transistors, noises of 10 mV or more occur. With noises caused by peripheral circuitry taken into account, the noise level reaches 10 mV or higher. Therefore, a sufficient signal-to-noise ratio cannot be achieved in the TMR element, for which a sense current of 10 $\mu$A can provide a memory cell read voltage of 25 mV.

For improving the signal-to-noise ratio, such an approach is widely used that an output voltage of a selected memory cell is compared with a reference voltage, and the differential voltage is amplified. In this differential amplification using the reference voltage, a dummy cell is generally used. The dummy cell having the same characteristics as the memory cell is used for the purpose of removing noises occurring on a data line of the selected memory cell and canceling an offset in memory cell output voltage due to variations in characteristics of the access transistors of the memory cells.

However, in the circuit for generating the reference voltage, the selected memory cell and the dummy cell are connected to different access transistors. Therefore, it is difficult to remove completely the offset in output voltage of the memory cell, which is caused by variations in characteristics of the access transistors.

The difference in sense current between H- and L-level data is on the order of microampere ($\mu$A). In the case of utilizing the reference voltage, the reference voltage is required to have a magnitude intermediate between the magnitudes of the memory cell currents or memory cell voltages in reading H- and L-data. A difference between the reference voltage and memory cell voltage or between the reference current and memory cell current is further reduced, so that a malfunction may occur due to variations in transmission characteristics between a path transferring data of the selected memory cell and a path transferring data of the dummy cell.

A tunnel film (a dielectric film of the TMR element) of the memory cell is an insulating film causing a tunnel current to flow, and has a resistance value depending on the film thickness. Accordingly, if variation is present in film thickness of the tunnel film, this increases difference in resistance value of the tunneling film between the selected memory cell and the dummy cell, so that differential input voltages to the differential amplifier may become insufficient or inverted. Therefore, the memory cell data cannot possibly be accurately detected.

FIG. 23 shows an example of a structure of a write driver for driving write bit line WBL. In accordance with the write data, one of the write drivers arranged on the opposite sides of write bit line WBL is activated. More specifically, the word line driver arranged for write word line WWL supplies a current to the selected write word line in a fixed direction regardless of the write data. In write bit line WBL, a flowing direction of the current is determined depending on the write data. FIG. 23 shows a write driver 950 arranged on one side of write bit line WBL.

Write driver 950 includes a P-channel MOS transistor 952 for coupling write bit line WBL to a power supply node when made conductive, and an N-channel MOS transistor 954 for electrically coupling write bit line WBL to a ground node when made conductive.

During a standby state, write driver 950 is supplied with a signal at H level (a level of power supply voltage VCC). In this state, write bit line WBL is maintained at the ground voltage level. In MOS transistor 952, however, a subthreshold current Il flows even if their gate and source are at the same level of power supply voltage VCC. This subthreshold current Il is discharged to the ground node via MOS transistor 954 in the conductive state.

Even if read word line RWL is at the ground voltage level during the standby, a subthreshold current likewise flows via access transistor 910 in memory cell MC. Accordingly, leakage current Ilb flowing from bit line write driver 950 to write bit line WBL further flows through variable resistance element (TMR element) 912 and access transistor 910 to read bit line RBL kept at the ground voltage level. Write bit line WBL is arranged corresponding to each column of memory cells MC, and the write drivers on one side are equal in number to the memory cell columns, precisely two times the number of the memory cell columns. Therefore, a sum of leakage currents Il (Ila and Ilb) during the standby takes an innegligible value.

Drivers similar to bit line write driver 950 are provided for write word line WWL and for read word line RWL, so that leakage currents flow due to subthreshold currents in MOS transistors provided therein during the standby. Accordingly, the leakage currents in this drive circuit group increase the current consumption during the standby, so that a specification requirement of an ultra low standby current, which is required for application such as portable equipment, cannot be satisfied, and the application range is restricted.

For reducing the subthreshold current, it may be considered to increase an absolute value of the threshold voltage. In this case, however, the responsivility of the MOS transistor is deteriorated, and a drive current also decreases, if the transistor size is unchanged. Accordingly, if the absolute value of the threshold voltage is made great, it is impossible to reduce the transistor sizes for a faster operation, and thus the device shrinking is impeded.

SUMMARY OF THE INVENTION

Accordingly, an object of the invention is to provide a nonvolatile semiconductor memory device, in which data can be accurately read with a low current consumption.

Another object of the invention is to provide a semiconductor memory device, in which a leakage current during the standby is reduced without impairing a high speed operation.

A nonvolatile semiconductor memory device according to a first aspect of the present invention includes a plurality of memory cells each having an internal state determined in accordance with storage data, and holding the internal state for storing data; a signal line drive circuit for driving a signal line connected to a selected memory cell in accordance with at least an address signal in a memory cell selecting operation; and a power source circuit coupled to a power supply node of the signal line drive circuit for supplying a power supply voltage to the signal line drive circuit. The power source circuit changes a level of the voltage applied to the power supply node in accordance with an operation mode.

A nonvolatile semiconductor memory device according to a second aspect of the present invention includes a plurality of memory blocks, formed at substrate regions isolated from each other, each including a plurality of memory cells. The memory cell has an internal state determined depending on storage data, and maintains the internal state for storing the data.

The nonvolatile semiconductor memory device according to a second aspect of the present invention further includes a plurality of array drive circuits, arranged corresponding to the plurality of memory blocks in substrate regions isolated from the substrate regions of the respective memory blocks, each selectively driving a signal line coupled to a memory cell when the memory cell in a corresponding memory block is selected.

A semiconductor device according to a third aspect of the present invention includes a first transistor having an output node connected to a first interconnection line, a conduction node and a control electrode node supplied with a current when made active; a substrate potential supply circuit for supplying a potential intermediate between a potential on the output node and a potential on the conduction node to a substrate region of the first transistor in a first operation mode; and an isolating circuit for isolating the substrate region and the substrate potential supply circuit from each other in a second operation mode different from the first operation mode.

A voltage applied to a power supply node of a circuit for driving the signal line connected to a memory cell is changed in accordance with the operation mode in the invention of the first aspect. Thus, a leakage current during the standby can be reduced without lowering a driving capability of the signal line drive circuit.

A substrate region of the memory block is isolated from a substrate region of the peripheral array drive circuit so that the bias voltage on each of the substrate regions can be optimized individually in the invention of the second aspect. Thus, a driving power of the array drive circuit can be optimized.

The substrate region of each circuit is isolated so that propagation of noises is limited within each substrate region, and a noise margin is improved in the invention of the third aspect. Each memory block can be driven in a block basis so that the current consumption can be further reduced.

By adjusting a back gate voltage in accordance with the operation mode, it is possible to increase the driving power of the transistor in operation without increasing the size of the transistor so that the memory cell can be selected quickly without increasing an area of the circuit. Therefore, it is possible to achieve the semiconductor memory device, which occupies only a small area and can operate fast with a low current consumption.

In accordance with the operation mode, the substrate potential supply circuit and the substrate region of the transistor are isolated in the invention of the third aspect. Thus, the potential of the transistor substrate region can be changed in the second operation mode so that operation characteristics of the transistor can be tested, and the first transistor can be operated in optimum operation characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows a whole structure of a nonvolatile semiconductor memory device according to the invention;

DESCRIPTION OF THE PREFERRED EMBODIMENTS

First Embodiment

Figure 2:
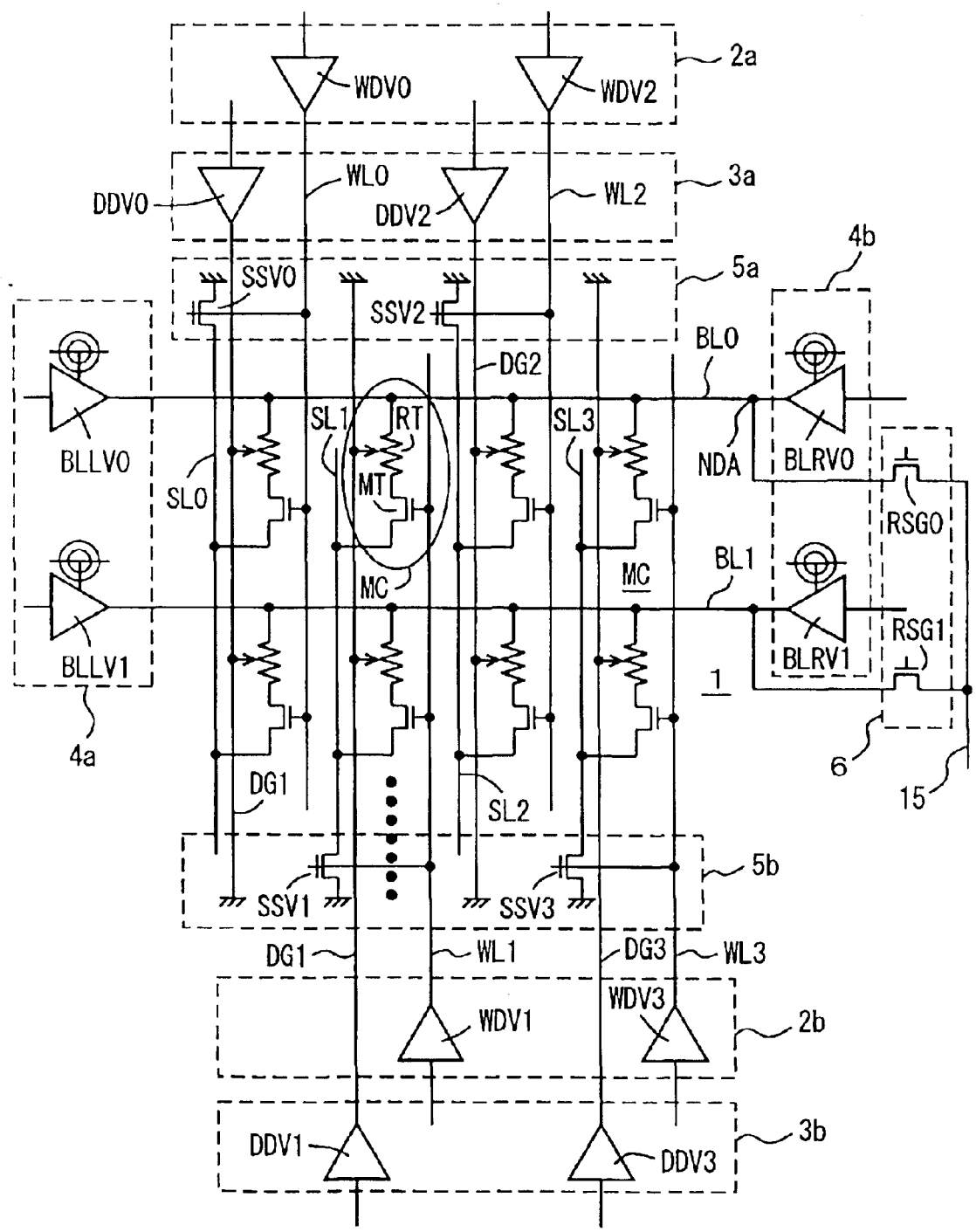
FIG. 2 specifically shows a structure of a main portion of the nonvolatile semiconductor memory device shown in FIG. 1.

FIG. 1 schematically shows a whole structure of a nonvolatile semiconductor memory device according to a first embodiment of the invention. In FIG. 1, the nonvolatile semiconductor memory device includes a memory cell array 1 having memory cells MC arranged in rows and columns. Memory cell MC includes a variable resistance element (TMR element) RT having a resistance value variable in accordance with storage data, and an access transistor MT for selecting resistance element RT for connection to a source line SL in accordance with a signal on a word line WL. Access transistor MT is formed of an N-channel MOS transistor.

A write word line, a read word line, a write bit line and a read bit line are arranged corresponding to memory cell MC. For the sake of simplicity, the write bit line will be merely referred to as "bit line BL", and the write word line will be referred to as "digit line DL", the read word line referred to as "word line WL", and the read bit line as "source line SL" in the following description.

In the data write operation, resistance element RT has the magnetization direction determined in accordance with magnetic fields induced by currents flowing through digit and bit lines DL and BL, and the resistance value thereof is determined. In the data write operation, the current flows through digit line DL in a fixed direction, and the current flows through bit line BL in a direction depending on the logical level of the write data.

On the opposite sides in the row direction (the extending direction of the word line) of memory cell array 1, there are arranged word line drive circuits 2a and 2b are arranged for driving word lines WL when active, and digit line drive circuits 3a and 3b for driving digit lines DL when active. A source line drive circuit 5 is arranged adjacently to word line drive circuit 2b on one side of memory cell array 1.

World line drive circuits 2a and 2b are activated, when a word line activating signal WLEN is activated, to drive word line WL corresponding to an addressed row to the selected state. Word line activating signal WLEN is activated in the data read operation.

Digit line drive circuits 3a and 3b are activated in response to activation of a digit line activating signal DGEN, and supplies a current in a predetermined direction to digit line DL corresponding to the row designated by an address signal RAD.

Source line drive circuit 5 drives source line SL arranged corresponding to the selected word line to the ground voltage level in accordance with the signal on selected word line WL.

Word line WL, source line SL and digit line DL are arranged corresponding to each row of memory cells MC, and the bit lines are arranged corresponding to the respective memory cell columns.

Word line drive circuits 2a and 2b are arranged on the opposite sides of memory cell array 1, respectively, and digit line drive circuits 3a and 3b are arranged on the opposite sides of memory cell array 1, respectively. In word line drive circuits 2a and 2b, word line drivers are arranged corresponding to word lines WL. In digit line drive circuits 3a and 3b, digit line drivers are arranged corresponding to digit lines DL, respectively.

Owing to such arrangement of arranging word line drive circuits 2a and 2b on the opposite sides of memory cell array 1, respectively, and digit line drive circuits 3a and 3b on the opposite sides of memory cell array 1, respectively, these word line drivers and digit line drivers can be arranged alternately in the column direction of memory cell array 1 so that pitch conditions of these word line drivers and digit line drivers can be mitigated.

On the opposite sides in the column direction of memory cell array 1, bit line drive circuits 4a and 4b for driving bit lines BL are arranged, respectively. A read select circuit 6 is arranged on one side of memory array 1 adjacent to bit line drive circuit 4b, for selecting a bit line corresponding to an addressed column in memory cell array 1 in data reading. Bit line drive circuits 4a and 4b include bit line drivers arranged corresponding to bit lines BL, respectively. Bit line drive circuits 4a and 4b receive a column address signal CAD, write data Din, a read activating signal READ and a write activating signal WRITE.

Bit line drive circuits 4a and 4b are kept in the output high impedance state during data reading. In this case, bit line BL corresponding to a selected column is supplied with a sense current from an internal data line via read select circuit 6. In the data write operation, one of bit line drive circuits 4a and 4b drives bit line BL arranged corresponding to the addressed column to the power supply voltage level, and the other drives this bit line in the addressed column to the ground voltage level. Thereby, a current flows through selected bit line BL in a direction depending on write data Din.

Referring to FIG. 1, in writing data "1", bit line drive circuit 4a drives bit line BL in the selected column to H level, and bit line drive circuit 4b drives the bit line in the selected column to the ground voltage level. In writing data "0", bit line drive circuit 4b drives bit line BL in the selected column to H level, and bit line drive circuit 4a drives the bit line in the selected column to the ground voltage level. Thus, the direction of the current flowing through bit line BL can be changed depending on "1" and "0" of the write data.

The nonvolatile semiconductor memory device further includes a read circuit 7 for producing internal read data by detecting the current flowing through bit line BL selected by read select circuit 6, a holding circuit 8 for holding internal read data read by read circuit 7, an output circuit 9 for producing external output data Q in accordance with the internal read data applied by read circuit 7, an input circuit 10 for producing internal write data Din in accordance with externally applied data D in the data write operation, a control circuit 11 for producing control signals required for internal operations in accordance with externally applied read and write instructing signals RE and WR, and an address input circuit 12 for producing internal row address signal RAD and an internal column address signal CAD in accordance with an externally applied address signal AD.

Control circuit 11 produces the control signals required for writing and reading data, and in FIG. 1, read activating signal READ, write activating signal WRITE, word line activating signal WLEN and digit line activating signal DGEN produced by control circuit 11 are representatively shown as the control signals.

In this data read operation, read circuit 7 supplies a sense current to the bit line in the selected column via read select circuit 6 in accordance with read activating signal READ, and holding circuit 8 holds the memory cell data read by read circuit 7. In this state, the reference data is written into the selected memory cell again, and read circuit 7 reads the reference data written into the selected memory cell, from the selected memory cell again. Read circuit 7 compares the reference data thus read with the data held by holding circuit 8, and generates the signal according to a result of the comparison to output circuit 9.

Output circuit 9 produces external output data Q in accordance with the data applied by read circuit 7. Accordingly, the reference data is written into and read from the same memory cell so that it is not necessary to use a dummy cell. Without an influence by variations in parameter caused by using a dummy cell, the memory cell data can be accurately compared with the reference data, and external output data Q can be produced based on the result of comparison.

The nonvolatile semiconductor memory device further includes a power source circuit 17 for supplying the power supply voltage to each circuit and a substrate bias circuit 19 for supplying a bias voltage to the substrate region of each circuit.

Power source circuit 17, the construction of which will be described later, is configured to change the state of application of power source voltages Vdd and Vss in each circuit depending on the operation mode. Thus, power source circuit 17 has a main power source line coupled to the power source node, and sub power source lines selectively and electrically connected to the main power source in accordance with the operation mode. Internal circuits are coupled to the corresponding sub power source lines so that the operation power source voltages are supplied to the corresponding internal circuits. The hierarchical power source structure including the main- and sub power sources is utilized for reducing the leakage current during the standby, to reduce a current consumption.

Substrate bias circuit 19 supplies substrate bias voltages to memory cell array 1, and to the drive circuits and others for selecting a memory cell. FIG. 1 representatively shows a substrate bias voltage Vpw applied to a P-well and a substrate bias voltage Vnw applied to an N-well region. By changing these substrate bias voltages in accordance with the operation mode, it is possible to increase the absolute value of the threshold voltage of the transistors during the standby for reducing a leakage current, and it is also possible to decrease in absolute value the threshold voltage of the transistors for operating the transistors at high speed and increasing a current driving power during the active cycle.

Owing to power source circuit 17 and substrate bias circuit 19, it is possible to reduce the current consumption and to increase the operation speed without changing the transistor size.

FIG. 2 shows more specifically the structures of memory cell array 1, word line drive circuits 2a and 2b, digit line drive circuits 3a and 3b, source line drive circuits 5a and 5b, and read select circuit 6 shown in FIG. 1. FIG. 2 representatively shows a construction of a portion related to memory cells MC arranged in two rows and four columns.

In FIG. 2, memory cell array 1 includes memory cells MC arranged in rows and columns. Memory cell MC includes resistance element RT and access transistor MT.

Word line drive circuit 2a includes word line drivers WDV0 and WDV2 arranged corresponding to even-numbered word lines WL0 and WL2, respectively, and word line drive circuit 2b includes word line drivers WDV1 and WDV3 arranged corresponding to odd-numbered word lines WL1 and WL3, respectively. Word line drivers WDV0 to WDV3 are arranged alternately on the opposite sides of word lines WL0 to WL3 for mitigating pitch conditions of word line drivers WDV0 to WDV3.

Digit lines DG0 to DG3 are arranged extending, in parallel to word lines WL0 to WL3, in the row direction. In digit line drive circuit 3a, digit line drivers DDV0 and DDV2 are arranged corresponding to even-numbered digit lines DG0 and DG2, respectively. In digit line drive circuit 3b, digit line drivers DDV1 and DDV3 are arranged corresponding to odd-numbered digit lines DG1 and DG3, respectively. Digit lines DG0 to DG3 each have an end coupled to the ground node. Therefore, when these digit line drivers DDV0 to DDV3 are selectively activated to drive corresponding digit lines DG0 to DG3 to H level in the data write operation, a current automatically flows through the selected digit line.

In digit line drive circuits 3a and 3b, digit line drivers DDV0 to DDV3 are alternately arranged on the opposite sides of digit lines DG0 to DG3, whereby the pitch conditions of these digit line drivers are mitigated.

Where digit line drivers DDV0 to DDV3 are arranged alternately on the opposite sides of the digit lines, the direction of current flowing through the digit line is different between the even-numbered row and the even-numbered row. In this case, the data of the memory cell in the even-numbered row is inverted by using, e.g., the least significant bit of the row address signal in the data read operation. For example, by using an EXNOR circuit receiving the memory cell data and the least significant bit of the row address signal, such processing is implemented that the read data of the memory cell is inverted when the least significant row address signal bit is "1", and the memory cell data is merely buffered and output when the least significant row address signal bit is "0". Thus, even in the construction of causing the current to flow through the digit line in the direction depending on the position of the selected memory cell, it is not necessary to change the direction of the current flowing through the bit line so that the processing in data writing can be simplified.

In parallel to digit lines DG0 to DG3, source lines SL0 to SL3 are arranged extending in the row direction. Each of source lines SL0 to SL3 is coupled to sources of access transistors MT of memory cells MC arranged in the corresponding row.

Source line drive circuit 5a includes source line drivers SSV0 and SSV2 arranged corresponding to source lines SL0 and SL2, respectively. Source line drive circuit 5b includes source line drivers SSV1 and SSV3 arranged corresponding to source lines SL1 and SL3, respectively. These source line drivers SSV0 to SSV3 are formed of switching transistors made conductive when corresponding word lines WL0 to WL3 are driven to the selected state (H level).

By arranging these source line drivers SSV0 to SSV3 near word line drivers WDV0 to WDV3, respectively, these source line drivers SSV0 to SSV3 can be made conductive to drive source lines SL0 to SL3 to the ground voltage level at a faster timing.

By driving the source lines to the ground potential via source line drivers SSV0 to SSV3 in accordance with the signals on word lines WL0 to WL3, it is not necessary to provide a circuit for controlling the potentials on the source lines, and the circuit configuration can be simple.

In source line driver SSV, a reset transistor is arranged for maintaining an unselected source line at an intermediate voltage level. For the sake of simplicity of drawing, FIG. 2 does not show the precharge transistor for holding the unselected source line at the intermediate voltage level.

Bit lines BL0 and BL1 are arranged corresponding to columns of memory cells MC, and resistance elements RT of memory cells MC in the corresponding columns are coupled to the bit lines BL0 and BL1.

Bit line drive circuit 4a includes bit line drivers BLLV0 and BLLV1 arranged corresponding to bit lines BL0 and BL1, respectively, and bit line drive circuit 4b includes bit line drivers BLRV0 and BLRV1 arranged corresponding to bit lines BL0 and BL1.

In the data write operation, one of bit line drivers BLLV and BLRV corresponding to a selected bit line applies a signal at H level corresponding to the write data (data to be written), and the other bit line driver generates a signal at L level. Thus, a current flows through the selected bit line BL in the direction corresponding to the write data. In the data read operation, these bit line drivers BLLV0, BLLV1, BLRV0 and BLRV1 are maintained in the output high impedance state.

Alternatively, bit line drive circuits 4a and 4b may be configured such that bit line drivers BLLV and BLRV corresponding to the selected bit line enter the output high impedance state, and bit line drivers BLLV and BLRV corresponding to the unselected bit line outputs L level signals.

In the data read operation, a sense current is supplied to a selected bit line from an internal data line 15 via read select circuit 6, and the current is detected by the read circuit for reading the internal data.

Read select circuit 6 includes read select gates RSG0 and RSG1 provided corresponding to bit lines BL0 and BL1, respectively. These read select gates RSG0 and RSG1 are made conductive in accordance with an output signal of a column decoder (not shown) in the data read operation, and electrically couples a corresponding bit line BL to internal data line 15 when made conductive.

Figure 3:
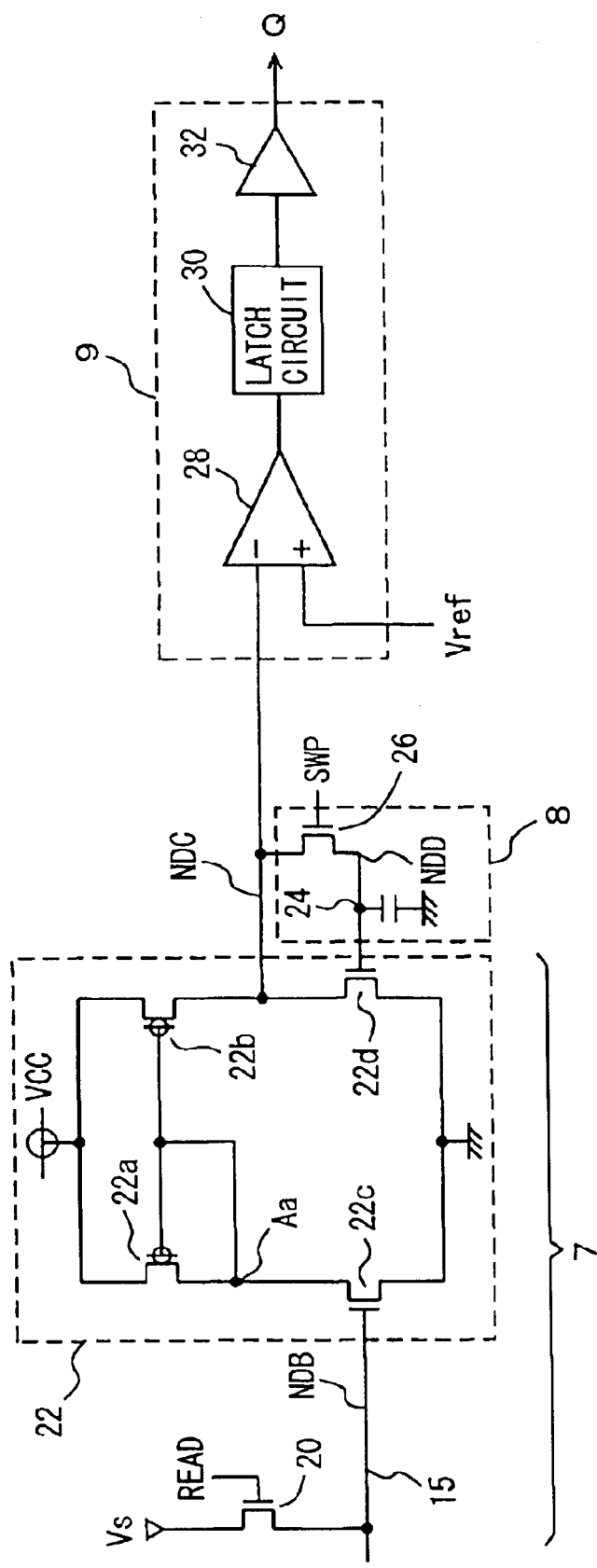
FIG. 3 shows, by way of example, a construction of a data read portion of the nonvolatile semiconductor memory device shown in FIG. 1.

FIG. 3 shows an example of the constructions of read circuit 7, holding circuit 8 and output circuit 9 shown in FIG. 1. In FIG. 3, read circuit 7 includes a current source transistor 20 for supplying a current to internal data line 15 in response to activation of read activating signal READ, and a differential amplifier circuit 22 for comparing a potential of a node NDB on the internal data line and the potential held by holding circuit 8. Current source transistor 20 is made conductive to supply a current from the sense power supply node to internal data line 15 when read activating signal READ is active. A sense voltage Vs on the sense power supply node is set to a relatively low voltage level so that the potential on the selected bit line may not rise excessively.

Differential amplifier circuit 22 includes a P-channel MOS transistor 22a connected between the power supply node and an internal node Aa, and having a gate connected to internal node Aa, a P-channel MOS transistor 22b connected between the power supply node and a node NDC, and having a gate connected to internal node Aa, an N-channel MOS transistor 22c coupled between internal node Aa and the ground node, and having a gate coupled to node NDB (internal data line 15), and an N-channel MOS transistor 22d connected between a node NDC and the ground node and receiving at its gate the potential held by holding circuit 8.

Differential amplifier circuit 22 generates a signal at H level when the potential on node NDB is higher than the potential held by holding circuit 8 or the potential on node NDD, and generates a signal at L level to node NDC when the potential on node NDB is lower than the potential on node NDD.

Holding circuit 8 includes a capacitance element 24 receiving the potential on node NDD, and a switching transistor 26 for electrically coupling nodes NDC and NDD together in activation of a holding instructing signal SWP. In FIG. 3, switching transistor 26 is formed of an N-channel MOS transistor. However, switching transistor 26 may be formed of a CMOS transmission gate, or a P-channel MOS transistor.

In potential holding circuit 8, when switching transistor 26 is made conductive, node NDC is electrically coupled to node NDD. In this state, the voltage level of output node NDC of differential amplifier circuit 22 is equal to that of reference data signal node NDD, and a voltage equal to the potential on node NDB is produced on node NDC. A current mirror stage formed of MOS transistors 22a and 22b has a mirror ratio of unity, and MOS transistors 22c and 22d have the equal size (ratio of the channel width to the channel length). Therefore, differential amplifier circuit 22 operates as a voltage follower having an amplification rate of unity, and produces a potential equal to that on node NDB on node NDC. Accordingly, when switching transistor 26 is non-conductive, capacitance element 24 holds, on node NDD, a potential corresponding to the memory cell data (amount of current) read to internal data line 15.

Output circuit 9 includes a differential amplifier 28 for differentially amplifying a reference voltage Vref and the potential on node NDC, a latch circuit 30 for latching the output signal of differential amplifier 28 and an output buffer circuit 32 for buffering an output signal of latch circuit 30 to produce external output data Q.

The level of reference voltage Vref is made low when the reference data of "0" is written into a selected memory cell in reading the memory cell data, and is made high when the data of "1" is employed as the reference data. Differential amplifier 28 produces binary data.

Latch circuit 30 is provided for adjusting the output timing of data. Output buffer circuit 32 is activated at a predetermined timing in the data read operation, to produce external output data Q by buffering the latched data of latch circuit 30.

Figure 4:
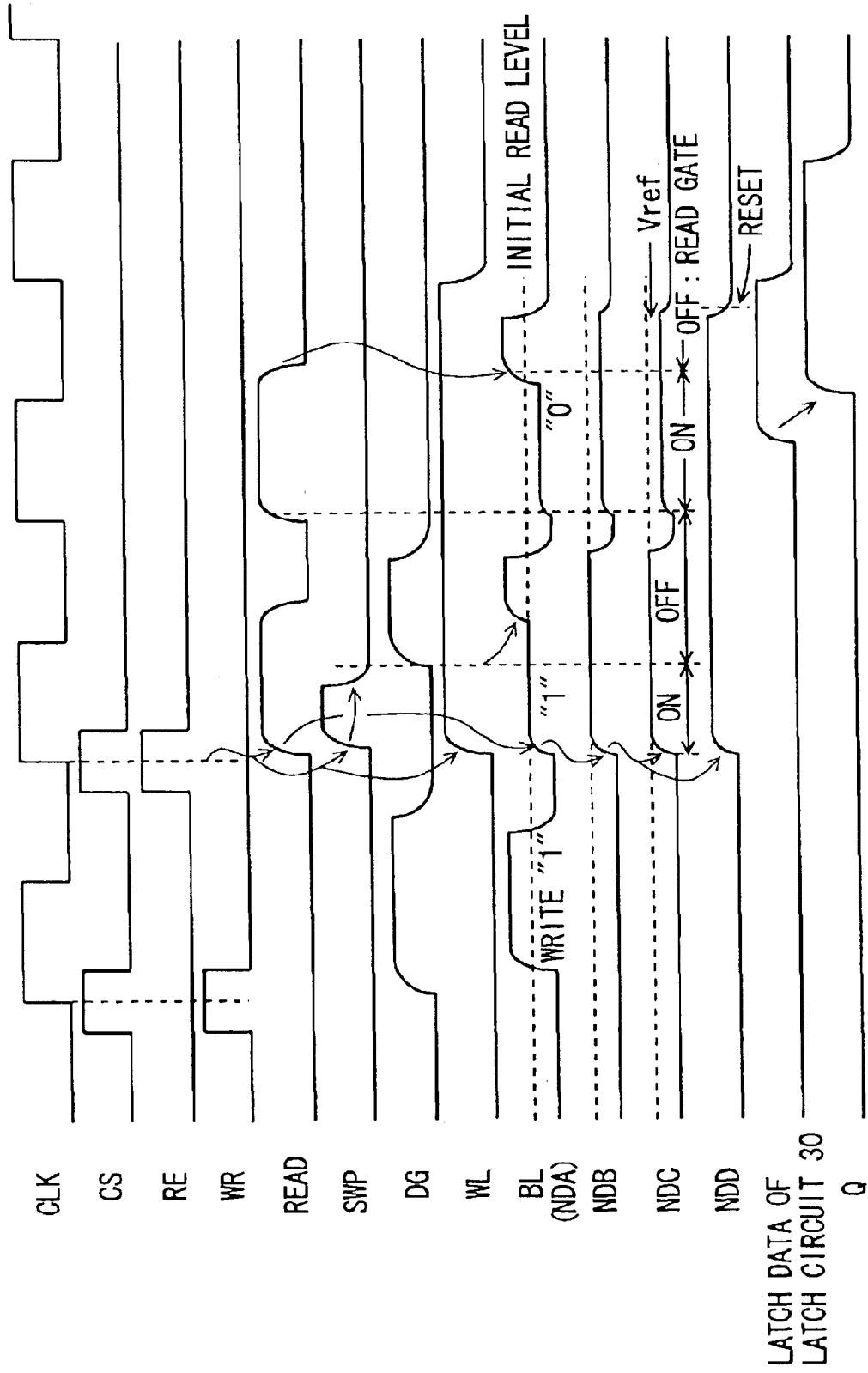
FIG. 4 is a signal waveform diagram representing operations of data reading by the circuits shown in FIGS. 2 and 3.

FIG. 4 is a timing chart representing operations of the circuits shown in FIGS. 2 and 3. Referring to FIG. 4, description will now be given on operations of the circuits shown in FIGS. 2 and 3 in data reading.

It is assumed that data "1" indicates a state that resistance element RT of the memory cell has a high resistance value, and data "0" indicates a state that resistance element RT has a low resistance value.

The operation mode is set in accordance with a combination of logical states of control signals at a rising edge of a clock CLK. In the data write operation, a chip select signal CS and a write instructing signal WR are set to H level at the rising edge of clock CLK. In this state, the data writing is designated so that digit line drive circuits 3a and 3b select a digit line DG to cause a current to flow through the selected digit line. In bit line drive circuits 4a and 4b, bit line drivers BLLV and BLRV drive the bit line in the selected column in accordance with the address signal and write data, so that a current flows in a direction determined by the write data.

FIG. 4 represents, by way of example, a state that data "1" is written into the selected memory cell.

In the data write operation, read select circuit 6 is in a non-conductive state, and current source transistor 20 shown in FIG. 3 is non-conductive so that nodes NDA to NDD are all at the ground voltage level.

In the next cycle, chip select signal CS and a read instructing signal RE are set to H level at the rising edge of clock CLK so that the data reading is instructed. In accordance with this data read instruction, read activating signal READ is activated, and word line drive circuits 2a and 2b drive word line WL in the selected row to H level. Also, source line drive circuits 5a and 5b set the source line corresponding to the selected row to the ground voltage level.

Read select circuit 6 electrically couples a bit line arranged corresponding to the selected column to internal data line 15 in accordance with the read column select signal produced in accordance with the address signal.

In accordance with the activation of read activating signal READ, current source transistor 20 is turned on, and the sense power supply node supplies a current to bit line BL selected by read select circuit 6. When the selected memory cell stores data "1", the voltage level of this bit line BL (node NDA) rises to a precharge voltage level.

In holding circuit 8, hold instructing signal SWP is at H level so that switching transistor 26 is rendered conductive to electrically couple nodes NDC and NDD together. In differential amplifier circuit 22, therefore, negative feedback is applied, the nodes NDD and NDB are kept at the same voltage level, and capacitance element 24 holds the potential on node NDD. When a predetermined period of time elapses, hold instructing signal SWP is deactivated to render switching transistor 26 non-conductive so that capacity element 24 holds the read data of this memory cell by the charged potential.

In this state, a so-called "read modify write" operation is performed to write the reference data at an already known logical level into the selected memory cell. In this operation, digit line DG is driven to the selected state again, and a current flows through bit line BL in a direction corresponding to the reference data. Even if read activating signal READ is active in the above state, read select gate RSG in read select circuit 6 is non-conductive so that an extra current does not flow to the bit line, and the reference data is written into the memory cell accurately. In this state, current source transistor 20 is non-conductive, and nodes NDB to NDD maintain the states attained when data is read from the memory cell previously.

When writing of the reference data is completed, bit line BL is temporarily driven to the ground voltage level because read select circuit 6 is non-conductive. Thereafter, read activating signal READ is activated again to render read select gate RSG of read select circuit 6 conductive. Current source transistor 20 supplies a current to the selected bit line again so that the potential on bit line BL increases. If the reference data is logic level "0", the potential on bit line BL, and therefore the potential on node NDA are lower than in the case where data "1" is read. The potential on node NDA is transmitted to node NDB, and the potential level of node NDB lowers from the potential level attained in most recent reading of storage data from the memory cell.

Differential amplifier circuit 22 drives node NDC to the potential level corresponding to a potential difference between nodes NDB and NDD. Since the potential level of node NDD is higher than the potential level of node NDB, the potential level of node NDC lowers below the potential level attained at the time of last reading of the storage data from the memory cell.

The drop of the potential level of node NDC is amplified by differential amplifier 28 included in output circuit 9 based on the comparison with reference voltage Vref, and latch circuit 30 latches the read data. Thereafter, output buffer circuit 32 externally outputs the read data.

In the output operation, the reference data is logic "0", and the storage data of the memory cell is logic "1". Therefore, data is rewritten into the selected memory cell for restoring the storage data of the memory cell.

This restoring operation is performed by determining whether the amplitude of the output signal of differential amplifier circuit 22 swings to a large extent. More specifically, when the amplitude of differential amplifier circuit 22 swings to a large extent, the storage data of memory cell has the inverted logical level of the reference data. In this case, the reference data is inverted to be written in the restoring operation. In contrast, when the output signal of differential amplifier circuit 22 and therefore the potential on node NDC are small in swing, the storage data of memory cell is the same in logical level as the reference data. In this case, the reference data is written into the selected memory cell.

The logical level of the reference data is determined in advance, and the voltage level of reference voltage Vref is set in accordance with the logical level of the reference data. Based on the comparison with reference voltage Vref, differential amplifier 28 determines the magnitude of the swing of the output signal of differential amplifier circuit 22. The configuration for the restoring will be described later in greater detail.

In the data write operation, therefore, the so-called read modify write operation is executed so that reading and writing of the data can be performed within one read cycle, and it is not necessary to prepare another cycle. Therefore, the cycles required for data reading can be equal to two clock cycles as represented in FIG. 4, and fast data reading can be achieved.

Figure 5A:
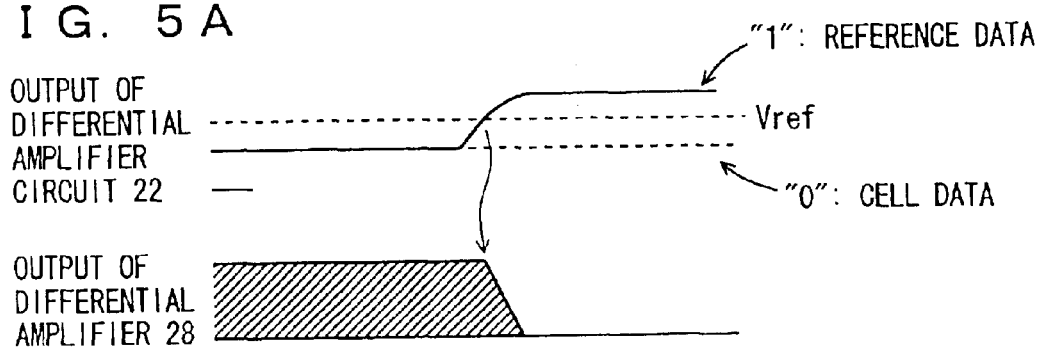
FIGS. 5A and 5B are signal waveform diagrams representing an operation of a data read portion shown in FIG. 3.

FIG. 5A illustrates changes that occur in output signal of differential amplifier 28 when reading data of "0" from the memory cell. As illustrated in FIG. 5, when data "0" is read from the memory cell, the output signal of differential amplifier circuit 22 is at the voltage level corresponding to data "0" owing to holding circuit 8. Thereafter, reference data "1" is written into the selected memory cell, and then is read therefrom for comparison in differential amplifier circuit 22. This reference data and the data held by holding circuit 8 are differentially amplified by differential amplifier circuit 22.

Data "0" corresponds to the state where resistance element RT has a small resistance value, and therefore corresponds to the state where the potential on the bit line is low. In this case, therefore, the output signal of differential amplifier circuit 22 greatly changes toward the H level, and significantly exceeds reference voltage Vref applied to differential amplifier 28. In this state, therefore, the output signal of differential amplifier 28 attains the L level, and the data corresponding to the storage data of the memory cell is produced by differential amplifier 28, and is latched by latch circuit 30 in a next stage.

Figure 5B:
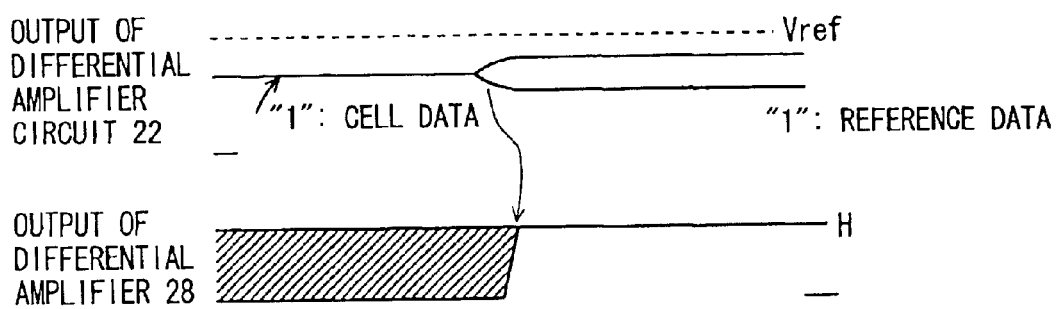

FIG. 5B schematically shows changes occurring in the output signals of differential amplifier circuit 22 and differential amplifier 28 when data "1" is read from the selected memory cell and is compared with reference data "1". When the storage data of the selected memory cell is "1" as illustrated in FIG. 5B, holding circuit 8 hold the data "1", and the output signal of differential amplifier circuit 22 is at the voltage level corresponding to this data "1".

Reference data "1" is written into the selected memory cell, then is read again and is supplied to differential amplifier circuit 22. Differential amplifier circuit 22 differentially amplifies reference data "1" transmitted from the selected memory cell and the data "1" held by holding circuit 8. The output signal of differential amplifier circuit 22 changes only slightly from the voltage level held by holding circuit 8 due to an offset value. In this case, the output signal of differential amplifier circuit 22 is lower than reference voltage Vref so that the output signal of differential amplifier 28 is attains H level.

Differential amplifier circuit 22 performs the differential amplification in an analog manner, and differential amplifier 28 operates as a comparing circuit, of which output signal changes in a binary signal form. Thereby, the signal corresponding to the storage data of the memory cell can be output from differential amplifier 28.

In the above description, when the reference data read from the memory cell is the same in logical level as the data held by holding circuit 8 in the differential amplifying operation, the output signal of differential amplifier circuit 22 is assumed to change only to a sufficiently small extent. However, the output signal of differential amplifier circuit 22 may be driven to the voltage level of an intermediate voltage (VCC/2) when the reference data read from the memory cell is the same in logical level as the data held by holding circuit 8, while changing significantly from the intermediate voltage level in accordance with the voltage difference between the reference data and the held data.

Accordingly, reference voltage Vref in differential amplifier 28 has the voltage level set depending on the logical level of the reference data. Thus, reference voltage Vref is set to a high voltage level when data of "1" is used as the reference data, and reference voltage Vref is set to a sufficiently low voltage level when data of "0" is used as the reference data.

Figure 6:
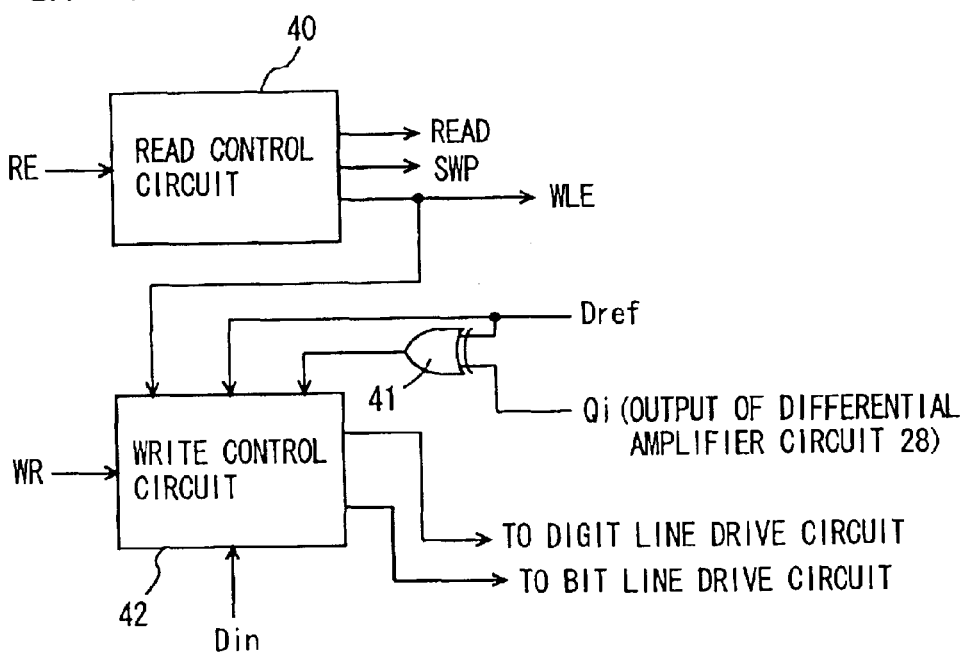
FIG. 6 schematically shows a construction of a main portion of a control circuit shown in FIG. 1.
Figure 11:
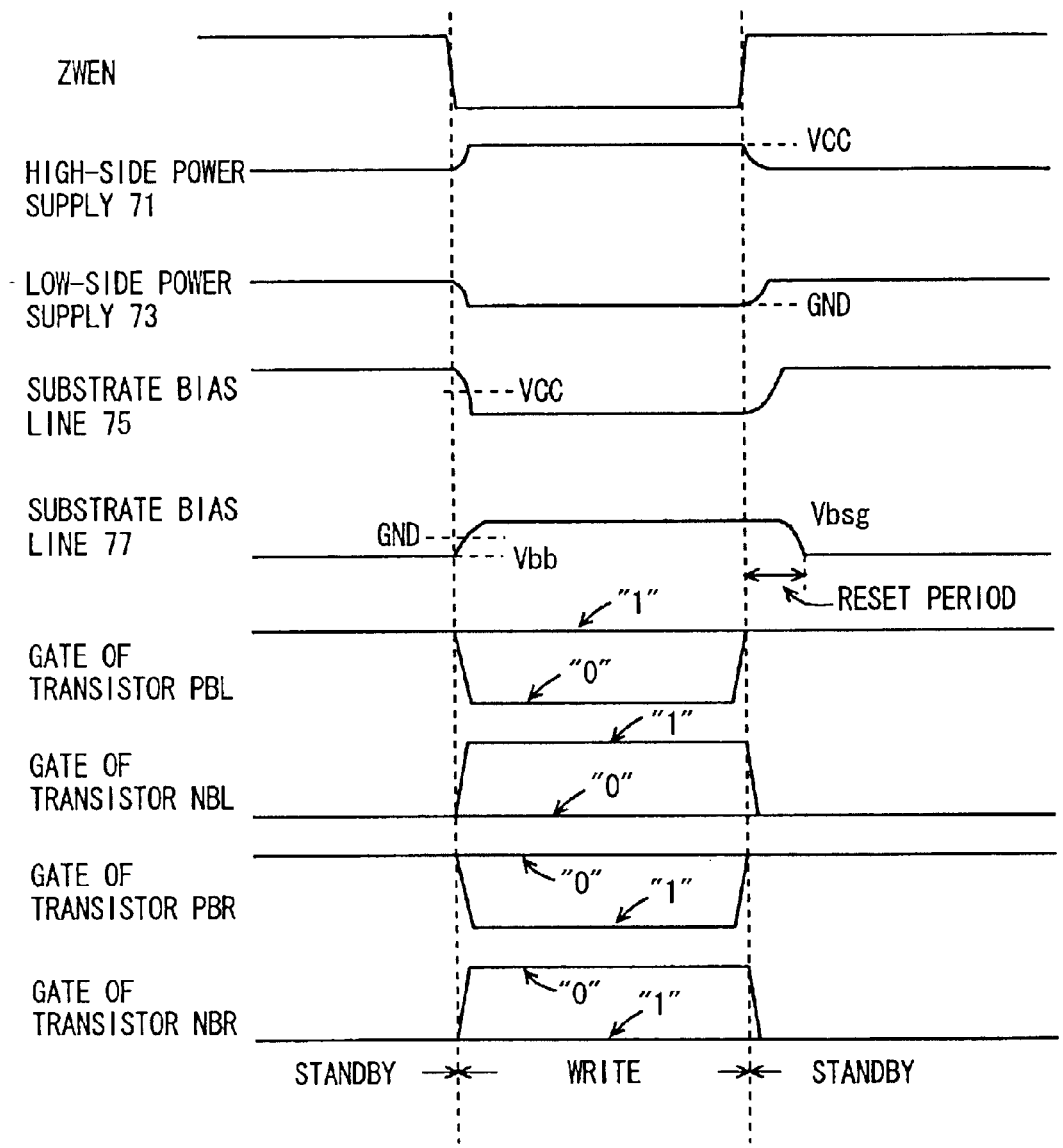
FIG. 11 is a signal waveform diagram representing an operation of the circuit shown in FIG. 10.

FIG. 6 schematically shows a construction of a portion related to writing and reading in control circuit 11 shown in FIG. 11. In FIG. 6, control circuit 11 includes a read control circuit 40 for controlling an operation required for data reading in response to externally supplied read instructing signal RE, and a write control circuit 42 for performing operation control required for the data writing in accordance with write instructing signal WR.

In FIG. 6, read control circuit 40 is shown producing read activating signal READ, hold instructing signal SWP and word line activating signal WLE. While word line activating signal WLE is active, word line WL is maintained in the selected state.

Control circuit 11 further includes an EXOR gate 41 for receiving reference data Dref and internal data Qi generated by differential amplifier 28. Write control circuit 42 controls the operation of the digit line drive circuits and the bit line drive circuits in accordance with word line activating signal WLE, reference data Dref, write data Din and the output signal of EXOR gate 41, and executes rewriting of the data into the selected memory cell.

Write control circuit 42 drives the digit line and bit line in accordance with write instructing signal WR and write data Din in the ordinary data write operation. In the data read operation, write control circuit 42 first performs writing of reference data Dref into the selected memory cell in response to the activation of word line activating signal WLE. When internal read data Qi corresponding to the storage data of the memory cell is produced, the rewriting (restoring) operation of the data into the selected memory cell is controlled in accordance with match/mismatch between reference data Dref and internal read data Qi.

EXOR gate 41 generates a signal at L level when reference data Dref and internal read data Qi are at the same logical level, and otherwise generates a signal at H level. Therefore, when EXOR gate 41 outputs the signal at H level, data "1" is written into the memory cell originally storing data "0", and therefore the inverted data of reference data Dref is written into the selected memory cell. Read control circuit 40 and write control circuit 42 may be formed of hardware, or may be formed of a sequence controller or other.

Figure 7:
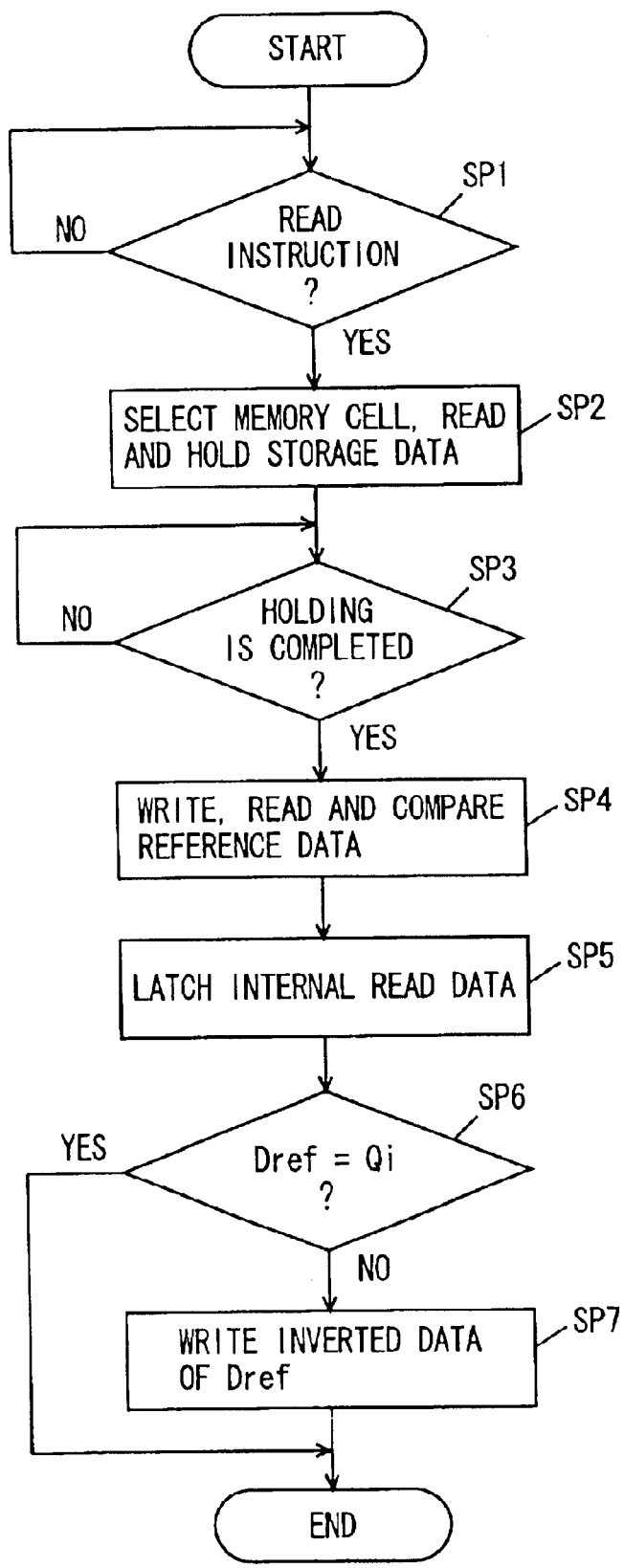
FIG. 7 is a flowchart representing an operation of the control circuit shown in FIG. 6.

FIG. 7 is a flowchart representing the operations of read and write control circuits 40 and 42 in data reading. Referring to FIG. 7, the operations for data reading by the circuits illustrated in FIG. 6 will now be described.

Read control circuit 40 monitors application of a read instruction (step SP1). The determination whether the read instruction is applied is made by detecting activation of chip select signal CS and read instructing signal RE.

When the read instruction is applied, read control circuit 40 activates read activating signal READ, hold instructing signal SWP and word line activating signal WLE in a predetermined sequence so that an addressed memory cell is selected and the storage data of the selected memory cell is read and held (step SP2). It is determined whether the holding of storage data of the selected memory cell is completed (step SP3). When the holding of storage data of the selected memory cell is completed, subsequently the processing is performed for writing and reading the reference data, and for comparing of the held data with the reference data (step SP4).

In step SP3, the determination whether the holding of storage data of the memory cell is completed is merely made in accordance with active and inactive states of hold instructing signal SWP. For writing the reference data, hold instructing signal SWP changes from the active state to the inactive state. After the holding of data is completed, write control circuit 42 is activated in response to activation of word line activating signal WLE to write reference data Dref into the selected memory cell. In reading data from the memory cell, the address of the selected memory cell is designated. The designated memory cell address is fixed internally, and the digit line and bit line are driven. In this operation, read activating signal READ is kept inactive for preventing flow of a sense current to the bit line in the selected column.

When write circuit 42 completes the writing of reference data Dref, read control circuit 40 activates read activating signal READ again so that the reference data is read for comparison. In the operation for this comparison, the bit line drive circuit and data line drive circuit are kept inactive.

Then, the reference data is compared with the held data, and thereafter latch circuit 40 stores the internal read data (step SP5).

In parallel with this latch operation, it is detected whether reference data Dref is the same in logical level as internal read data Qi (step SP6). EXOR gate 41 shown in FIG. 6 executes the operation for this detection. If the logical level of reference data Dref is different from that of internal read data Qi, the storage data of memory cell is in destruction. Therefore, the inverted data of reference data Dref is written into the selected memory cell to execute the restoring (step SP7).

When reference data Dref is the same in logical level as internal read data Qi, the selected memory cell has stored accurate data so that rewriting is not executed. As described above, the rewriting is executed only when the storage data of selected memory cell is destructed. Thus, the current required for the rewriting is reduced.

The rewriting processing in steps SP6 and SP7 is executed by write control circuit 42 shown in FIG. 42 based on reference data Dref and the output signal of EXOR gate 41. In the restoring operation, write control circuit 42 inverts reference data Dref, and drives the bit line drive circuits, in accordance with the inverted reference data, to the state opposite to that in writing of the reference data.

Reference data Dref may be externally applied in the data read mode. In this case where the reference data is externally applied, when writing of the reference data is performed in the so-called "read modify write" cycle, the reference data is written into the selected memory cell under the control of an external controller. Alternatively, reference data Dref may be stored in an internal register circuit, or may be internally produced being fixed at the power supply voltage level or ground voltage level by an interconnection line.

If reference data Dref and internal read data Qi are at the same logical level, the restoring operation is not performed as described above. After production of internal read data Qi, however, internal read data Qi may be rewritten into the original selected memory cell regardless of matching and mismatching between reference data Dref and internal read data Qi. Internal processing is performed to write reference data Dref and internal read data Qi into the selected memory cell at a predetermined timing in the data read operation.

The potential of the bit line in selecting a memory cell is determined by the relationship between the impedance (channel resistance) of the bit line precharging transistor, or sense current source transistor 20 and the impedance of the selected memory cell. Due to variations in manufacturing steps, an offset may occur between the input and output voltages of differential amplifier circuit 22 during the voltage follower operation. Even in this case, the reference data is read from the same selected memory cell so that the same offset occurs similarly in the differential amplifier circuit so that these offsets cancel each other. Reference voltage Vref can be set to an appropriate voltage level in accordance with the logical level of the reference data, the bit line potential and an amplification factor of differential amplifier circuit 22. An example of the construction of each drive circuit will now be described specifically.

Structure of Digit Line Drive Circuit

Figure 8:
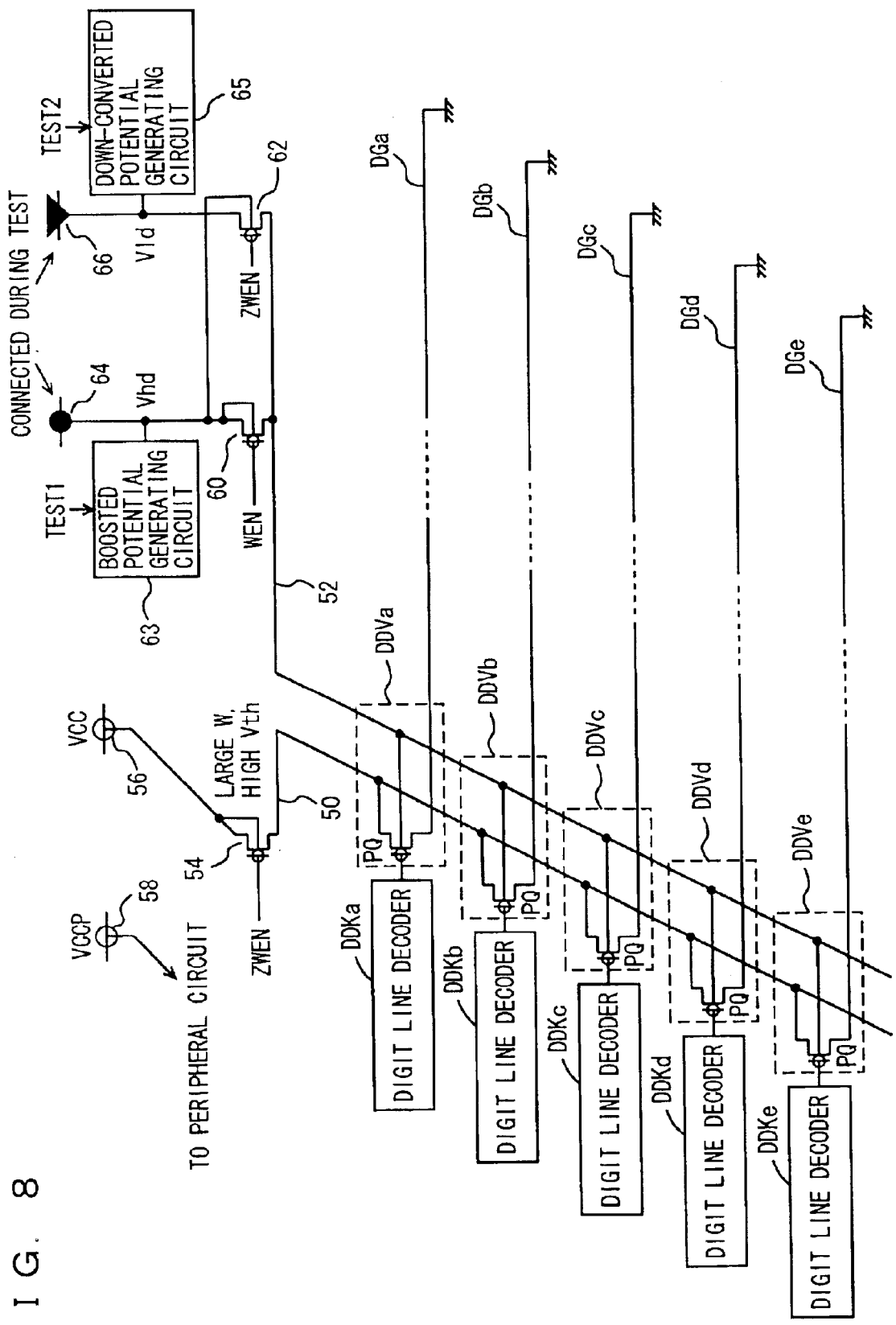
FIG. 8 shows structures of a digit line drive circuit shown in FIG. 1 and its power supply portion.

FIG. 8 schematically shows structures of digit line drive circuit 3 and its power supply. In FIG. 8, digit line drivers DDVa to DDVe are arranged corresponding to digit lines DGa to DGe. Digit lines DGa to DGe are coupled at their ends opposed to digit line drivers DDVa to DDVe to the ground node.

Each of digit line drivers DDVa to DDVe is formed of a P-channel MOS transistor PQ, and has a source coupled to a digit power supply line 50 and a back gate commonly coupled to a substrate bias line 52.

Digit line decoders DDKa to DDKe are arranged corresponding to digit line drivers DDVa to DDVe, respectively. Digit line decoders DDKa to DDKe are each activated in the operation of writing data into a memory cell, and decode the address signal (not shown), and outputs a signal at L level when a corresponding digit line is to be selected. Digit line decoders DDKa to DDKe generates signals at H level (level of power supply potential VCC) when the corresponding digit lines are not selected.

Digit power supply line 50 is coupled to a power supply node 56 via a power supply transistor 54. Power supply transistor 54 is formed of a P-channel MOS transistor, and has a sufficiently large channel width W and a threshold voltage of a large absolute value. Power supply transistor 54 is made conductive to couple digit power supply line 50 to power supply node 56 when write enable signal ZWEN is at L level and instructs writing of data into the memory cell.

Power supply node 56 is isolated from a peripheral power supply node 58 for supplying a power supply voltage VCCP to peripheral circuits such as a control circuit. By isolating power supply node 56 from peripheral power supply node 58, it is possible to optimize parameters of a power supply system for the digit line drive circuits in a test, as will be described later. By changing the application state of the power supply voltage in accordance with the operation mode of the digit line drive circuit, it is possible to achieve reduction of the leakage current and others.

Substrate bias line 52 is coupled to a boosted potential generating circuit 63 via a switching transistor 60, and is coupled to a down-converted potential generating circuit 65 via a switching transistor 62. Switching transistor 60 is formed of a P-channel MOS transistor, and is made conductive to transmit the boosted voltage produced by boosted potential generating circuit 63, to substrate bias line 52 when digit line drive circuit is in the inactive mode. Switching transistor 62 is made conductive, when write enable signal ZWEN is at L level, and transmits a down-converted potential produced by down-converted potential generating circuit 65 to substrate bias line 52. Boosted potential generating circuit 63 produces a boosted voltage higher than power supply voltage VCC, and down-converted potential generating circuit 65 supplies a voltage lower than power supply voltage VCC. These switch transistors 60 and 62 have back gates commonly coupled to the output node of boosted potential generating circuit 63.

Write enable signal WEN is an inverted signal of write enable signal ZWEN, and is set to L level in the modes other than a mode of the data write operation. In the operation of writing data into a selected memory cell, write enable signal WEN is set to H level.

Boosted potential generating circuit 63 and down-converted potential generating circuit 65 are supplied with test mode instructing signals TEST1 and TEST2, respectively. Test mode instructing signals TEST1 and TEST2 are individually set for stopping the voltage generating operations of boosted and down-converted potential generating circuits 63 and 65 in the test mode, respectively.

In the test mode, the output node of boosted potential generating circuit 63 is coupled to node a 64, and the output node of down-converted potential generating circuit 65 is coupled to node a 66. In the test mode, these nodes 64 and 66 are coupled to pads that can supply voltages higher and lower than power supply voltage VCC, respectively.

Such a structure may be employed that nodes 64 and 66 are selectively coupled to a pad in accordance with test mode instructing signals TEST1 and TEST2, respectively. In the test mode, the voltages on these nodes 64 and 66 are externally set so that the bias voltage on substrate bias line 52 is adjusted for optimizing the leakage current and the current driving power of transistor PQ of the digit line driver.

Figure 9:
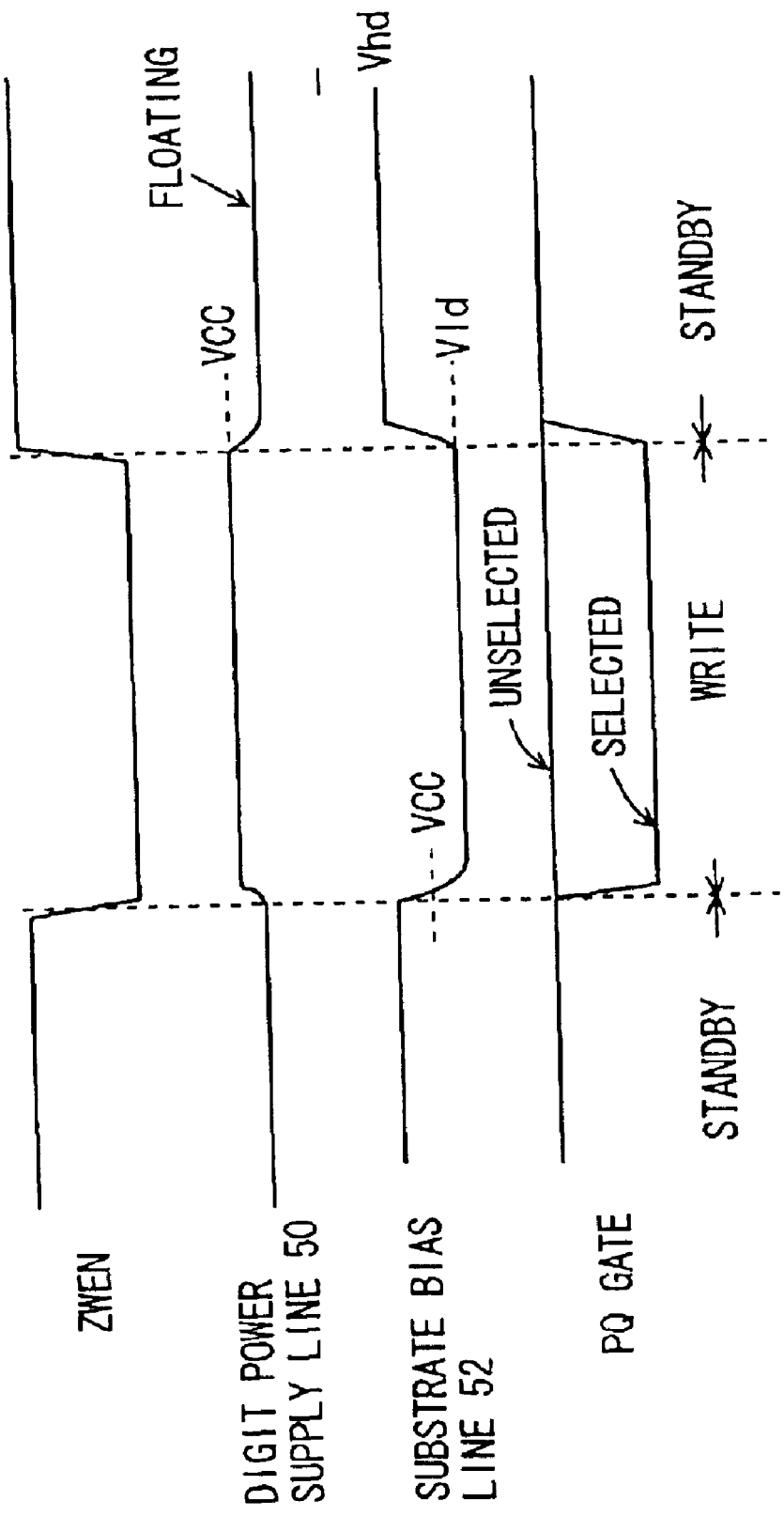
FIG. 9 is a signal waveform diagram representing an operation of the circuit shown in FIG. 8.

FIG. 9 is a signal waveform diagram representing an operation of the digit-line drive circuit shown in FIG. 8. Referring to FIG. 9, the operation of the circuit shown in FIG. 8 will now be described.

When write enable signal ZWEN is at H level equal to or higher than power supply voltage VCC level, power supply transistor 54 is non-conductive, all the output signals of digit line decoders DDKa to DDKe are at H level and all MOS transistors PQ in digit line drivers DDVa to DDVe are in a non-conductive state. Power supply transistor 54 has the threshold voltage Vth sufficiently high in absolute value, and a subthreshold leakage current is sufficiently suppressed. Transistor PQ of the digit line driver has a threshold voltage relatively small in absolute value, and can have an increased driving power in the write operation mode for rapidly driving a selected digit line to the selected state for causing a current to flow through the digit line.

Write enable signal ZWEN may be the same signal as write activating signal WRITE, or may be a signal that is active during the write cycle period. In the construction for restoring the data, writing of reference data and restoring of memory cell data are performed in the data read operation. Therefore, in the construction for performing the restoring operation in the data read operation, write enable signal ZWEN may be activated in the active cycle, i.e., when the memory cell is selected. If the voltages on power supply line 50 and substrate bias line 54 can be stabilized rapidly, write enable signal ZWEN may be made active when the data is written actually.

In this digit power supply line 50, when power supply transistor 54 is non-conductive, the voltage level of digit power supply line 50 is stabilized at the voltage level, at which the leakage current supplied from power supply transistor 54 is balanced with the leakage current discharged from MOS transistors PQ of digit line drivers. In this balanced state, the power supply voltage on digit power supply line 50 is at a lower level than power supply voltage VCC, and driver transistor PQ has the gate and source in a reverse-biased state, so that the leakage current of transistor PQ of the digit line driver is further suppressed.

In the above state, switching transistor 60 is conductive, and switching transistor 62 is non-conductive, so that a boosted voltage Vhd generated by boosted potential generating circuit 63 is transmitted to substrate bias line 52. This boosted voltage Vhd is at a higher level than power supply voltage VCC, and the absolute value of the threshold voltage of MOS transistor PQ is increased through a substrate bias effect so that the leakage current is further suppressed.

In data writing, write enable signal ZWEN attains L level, and write enable signal WEN attains H level. Responsively, digit power supply line 50 is supplied with power supply voltage VCC via power supply transistor 54, and substrate bias line 52 is supplied with a down-converted voltage Vld from down-converted potential generating circuit 52 via switching transistor 62. Power supply transistor 54 has a sufficiently large size (channel width), and therefore has a large current driving capability. One of digit line decoders DDKa to DDKe generates the output signal at L level so that corresponding MOS transistor PQ is rendered conductive to supply a current to the corresponding digit line in accordance with power supply voltage VCC on digit power supply line 50.

Substrate bias line 52 is supplied with down-converted voltage Vld lower than power supply voltage VCC, and MOS transistors PQ of the drivers have the threshold voltages of a small absolute value, and thus have increased current driving powers. Thus, MOS transistor PQ of digit line driver has a large current driving power to supply a sufficiently large current to the selected digit line.

When the writing of data into the selected memory cell is completed, write enable signal ZWEN attains H level again, and the memory device returns to the standby state again so that digit power supply line 50 attains the floating state, and substrate bias line 52 is set to the level of boosted voltage Vhd.

Down-converted potential Vld generated by down-converted potential generating circuit 65 is set to such a voltage level that the PN junction between the P-type impurity region and N-type substrate region of MOS transistor PQ of this driver is not made conductive even when it is biased forwardly. Specifically, the down-converted voltage Vld is set to the voltage level equal to or higher than (VCC−Vpn), where Vpn represents a built-in voltage of the PN junction.

In the test operation mode, boosted potential generating circuit 63 and down-converted potential generating circuit 65 are deactivated by test mode instructing signals TEST1 and TEST2, respectively. In this state, switching transistor 60 receives an externally supplied voltage via node 64, and switching transistor 62 receives an externally supplied voltage via node 66. By adjusting the voltage levels of nodes 64 and 66, a test is performed while changing the leakage current in digit line drive circuit 3.

By changing the voltage level of power supply voltage VCC on power supply node 56, the current amount flowing to the selected digit line is changed, and a margin of the power supply voltage with respect to the write data is measured. Test mode instructing signals TEST1 and TEST2 are individually set by using a test mode instruction and a specific address key. Thus, a margin of the boosted voltage with respect to the leakage current during standby and a margin of down-converted voltage Vld with respect to the write data in the data write operation are measured.

Accordingly, by forming a power supply of MOS transistor of the driver into a hierarchical structure using power supply transistor 54, it is possible change the driving power of MOS transistor PQ of this driver by adjusting the well substrate bias while reducing the leakage current of MOS transistor PQ, and it is possible to achieve the digit line driver having a large current drive capability and occupying a small area.

Structure of Bit Line Drive Circuit

Figure 10:
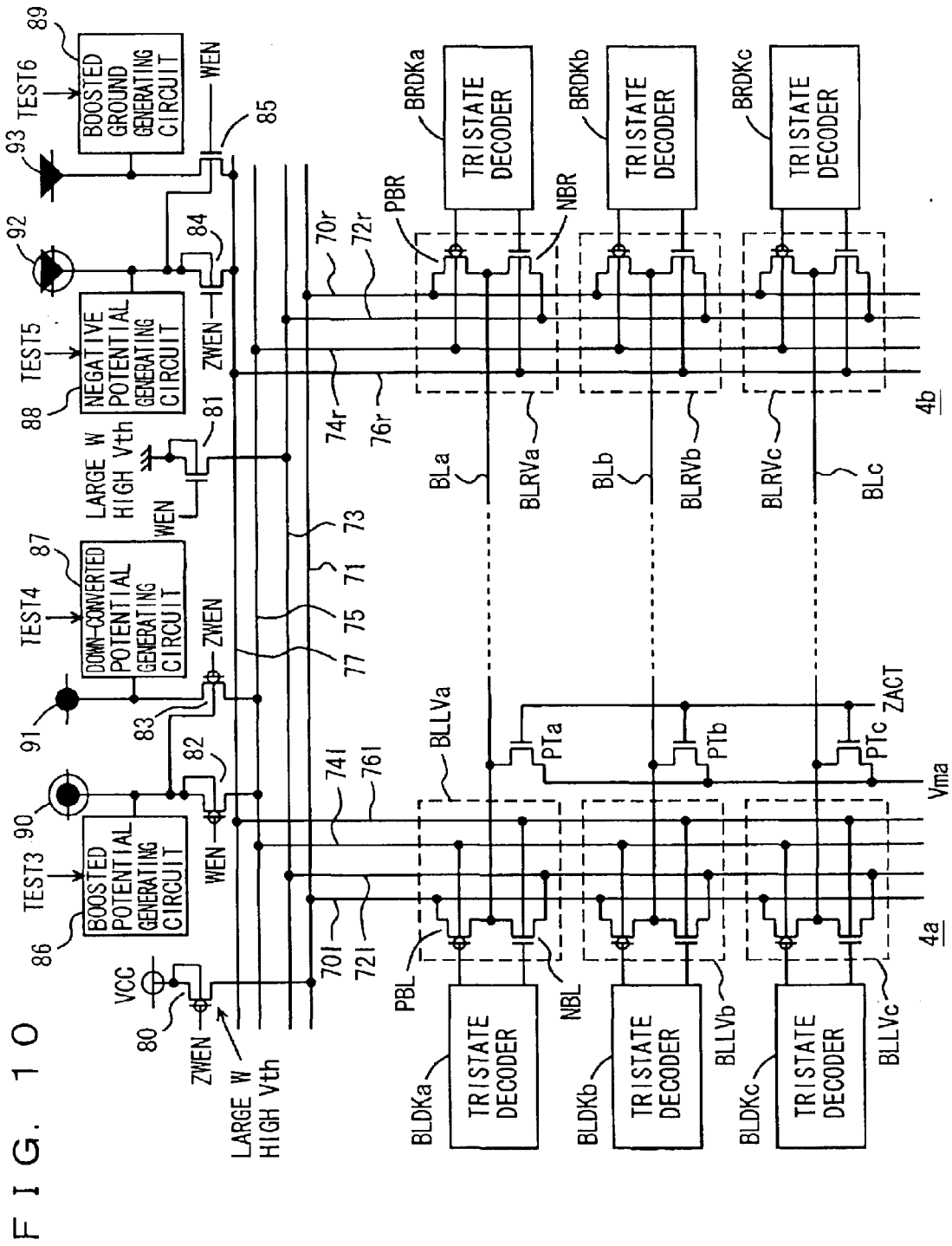
FIG. 10 shows constructions of a bit line drive circuit shown in FIG. 1 and its power supply portion.

FIG. 10 schematically shows constructions of bit line drive circuits 4 and 4b and their power source circuits. FIG. 10 representatively shows bit lines BLa to BLc.

Bit line drive circuit 4a includes bit line drivers BLLVa to BLLVc corresponding to these bit lines BLa to BLc, respectively. Tristate decoders BLDKa to BLDKc are provided corresponding to these bit line drivers BLLVa to BLLVc, respectively. Tristate decoders BLDKa to BLDKc, in the unselected state, set corresponding bit line drivers BLLVa to BLLVc to the output high impedance state, respectively. In the selected state, tristate decoders BLDKa to BLDKc set corresponding bit line drivers BLLVa to BLLVc to the state of H-level output or L-level output in accordance with the write data, respectively.

In bit line drive circuit 4b, bit line drivers BLRVa to BLRVc are provided corresponding to these bit lines BLa to BLc, respectively. These bit line drivers BLRVa to BLRVc are set to the output high impedance state, H-level signal output state or L-level signal output state in accordance with the output signals of tristate decoders BRDKa to BRDKc, respectively.

Each of bit line drivers BLLVa to BLLVc and BLRVa to BLRVc includes a P-channel MOS transistor PBL for generating a signal at H level and an N-channel MOS transistor NBL for generating a signal at L level.

In bit line drive circuit 4a, P-channel MOS transistors PBL of the drivers have their sources commonly coupled to a high-side local power source line 701, and N-channel MOS transistors NBL have their sources commonly coupled to a low-side local power source line 721. The back gates of MOS transistors PBL are commonly coupled to a local substrate bias line 741, and back gates of N-channel MOS transistors NBL are commonly coupled to a local substrate bias line 761.

In bit line drive circuit 4b, P-channel MOS transistors PBR have their sources commonly coupled to a high-side local power source line 70r, and their back gates commonly coupled to a local substrate bias line 74r. N-channel MOS transistors NBR have their sources commonly coupled to a low-side local power source line 72r, and their back gates commonly coupled to a local substrate bias line 76r.

High-side local power source lines 70l and 70r are commonly coupled to a high-side global power source line 71, and low-side local power source lines 72l and 72r are commonly coupled to a low-side global power source line 73. Local substrate bias lines 74l and 74r are commonly coupled to a global substrate bias line 75. Local substrate bias lines 76l and 76r are commonly coupled to a global substrate bias line 77.

High-side global power source line 71 is coupled to the power supply node via a power source transistor 80, which in turn is selectively made conductive in response to write enable signal ZWEN. Low-side global power source line 73 is coupled to the ground node via a power source transistor 81, which in turn is made conductive in response to activation of write enable signal WEN. The power supply node and ground node coupled to power source transistors 80 and 81 are isolated from the power supply nodes and ground nodes of peripheral circuits.

Global substrate bias line 75 is coupled to a boosted potential generating circuit 86 via a switching transistor 82, which in turn is selectively made conductive in response to write enable signal WEN, and is coupled to down-converted potential generating circuit 87 via a switching transistor 83, which in turn is made conductive in response to activation of write enable signal ZWEN. These switching transistors 82 and 83 are each formed of a P-channel MOS transistor.

Boosted and down-converted potential generating circuits 86 and 87 are set selectively to the active/inactive states by test mode instructing signals TEST3 and TEST4, respectively. In the test mode, an output node of boosted potential generating circuit 86 is coupled to a pad 90, and an output node of down-converted potential generating circuit 87 is coupled to a pad 91. In the test mode, pads 90 and 91 are individually supplied with a voltage higher than the power supply voltage and a voltage lower than the power supply voltage, respectively, and the tests of the leakage current and others are performed.

Global substrate bias line 77 is coupled to a negative potential generating circuit 88 via a switching transistor 84, which in turn is made conductive in response to write enable signal ZWEN, and is coupled to a boosted ground generating circuit 89 via a switching transistor 85, which in turn is made conductive in response to write enable signal WEN. Switching transistors 84 and 85 are each formed of an N-channel MOS transistor.

Negative potential generating circuit 88 and boosted ground generating circuit 89 are supplied with test mode instructing signals TEST5 and TEST6, respectively, and can be individually set to the test state. Negative potential generating circuit 88, in the active state, generates a negative voltage lower than the ground voltage. Boosted ground generating circuit 89, in the active state, generates a voltage higher than the ground voltage. Negative potential generating circuit 88 and boosted ground generating circuit 89 have output nodes coupled to the nodes (pads) 92 and 93 in the test mode, respectively, and the levels of the negative potential and boosted ground are externally set when they are set inactive in the test mode.

Power source transistors 80 and 81 have the threshold voltages of large absolute values, and also have sufficiently large channel widths W. Power source transistors 80 and 81 are set to have reduced leakage currents during the standby, and to have large driving currents in operation.

Precharge transistors PTa to PTc, which are selectively made conductive in response to an active cycle instructing signal ZACT, are provided to bit lines BLa to BLc, respectively. Precharge transistors PTa to PTc, in the on state, supply intermediate voltage Vma on corresponding bit lines BLa to BLc, respectively. Active cycle instructing signal ZACT is activated to attain L level in the mode of operation of writing or reading data. Bit line precharge transistors PTa to PTc prevent the bit lines from entering electrically floating state during the standby.

FIG. 11 is a signal waveform diagram representing an operation of the circuit shown in FIG. 10. Referring to FIG. 11, the operation for data writing of the bit line drive circuit shown in FIG. 10 will now be described.

During the standby, write enable signals ZWEN and WEN are at H- and L-levels, respectively. Therefore, power source transistor 80 is non-conductive, and high-side global power source line 71 is set in a floating state. Accordingly, power source transistor 81 is made non-conductive, and low-side power source line 73 is set in a floating state.

Tristate decoders BLDKa to BLDKc and BRDKa to BRDKc set the levels of the output signals such that bit line drivers BLLVa to BLLVc and BLRVa to BLRVc enter the output high impedance state. Thus, in each bit line driver, P-channel MOS transistors PBL and PBR receive the signals at H level on their gates, and N-channel MOS transistors NBL and NBR receive the signals at L level on their gates.

In the standby state, active cycle instructing signal ZACT is at H level, bit line precharge transistors PTa to PTc are made conductive, and bit lines BLa to BLc are set to the level of intermediate voltage Vma. The intermediate voltage Vma is at the level equal to half power supply voltage VCC. Bit lines BLa to BLc are maintained at the intermediate voltage level to suppress the leakage currents in the memory cells.

Switching transistors 82 and 84 are conductive, and substrate bias lines 75 and 77 receive the boosted voltage supplied from boosted potential generating circuit 86 and the negative voltage supplied from negative potential generating circuit 88, respectively. Accordingly, P-channel MOS transistors PBL and PBR receive, on their back gates, the boosted voltage, and N-channel MOS transistors NBL and NBR receive, on their back gates, the negative voltage. These MOS transistors PBL, PBR, NBL and NBR have the absolute values of threshold voltages increased through the back gate bias effect.

In this standby state, global power source lines 71 and 73 are in an electrically floating state, and the voltage level of high-side global power source line 71 is stabilized at the voltage level, at which the leakage currents of MOS transistors PBL and PBR are balanced with the leakage current of power supply transistor 80. In this balanced state, since the power source voltage on global power source line 71 is at a lower level than power supply voltage VCC, each of MOS transistors PBL and PBR has the gate and source set in a reverse-biased state, so that the leakage currents are further suppressed.

Low-side global power source line 73 is stabilized at the voltage level, at which the leakage currents of MOS transistors NBL and NBR are balanced with the leakage current of power source transistor 81. Therefore, the voltage level of low-side global power source line 73 is higher than the ground voltage, and each of MOS transistors NBL and NBR has the gate and source set in the reverse-biased state, so that the leakage currents thereof are further suppressed.

In the data write operation, a current is needed to supply to a selected one of bit lines BLa to BLc. The direction of the current flowing through the selected one of bit lines BLa to BLc depends on the write data. In the write operation, for high-side global power source line 71, power source transistor 80 is made conductive, and power supply voltage VCC is supplied to high-side local power source lines 70l and 70r. Also, power source transistor 81 is made conductive, and accordingly, the ground voltage is supplied to local power source lines 72l and 72r via global power source line 73.

For global substrate bias line 75, switching transistor 83 is made conductive, and switching transistor 82 is made non-conductive, so that down-converted potential generating circuit 87 supplies the down-converted voltage set to the voltage level lower than power supply voltage VCC, and the back gates of MOS transistors PBL and PBR are biased forwardly relative to the sources thereof.

Likewise, switching transistor 84 is made non-conductive and switching transistor 85 is made conductive, so that MOS transistors NBL and NBR are supplied, on their back gates, with a boosted ground voltage Vbsg from boosted ground generating circuit 89 via substrate bias lines 76l and 76r, and the back gates of MOS transistors NBL and NBR are biased forwardly.

Even when the such forward biasing is made, the voltage between the back gate and an impurity region is lower than the built-in voltage of the PN junction so that the PN junctions of these drive transistors maintain the off or non-conductive state.

Active cycle instructing signal ZACT attains L level to terminate the precharging of bit lines BLa to BLc by precharge transistors PTa to PTc.

In writing data "1", MOS transistor PBL is made non-conductive, and MOS transistor NBL is made conductive. MOS transistor PBR turns conductive, and MOS transistor NBR turns non-conductive. In writing the data "1", therefore, bit line drive circuit 4a drives a selected bit line to the ground voltage level, and bit line drive circuit 4b drives the selected bit line to the power supply voltage level.

In writing the data "0", MOS transistors PBL and NBR are made conductive, and MOS transistors NBL and PBR are made non-conductive. In this state, a current flows from bit line drive circuit 4a to bit line drive circuit 4b.

After writing the data by causing the current to flow through the bit line, return to the standby state is made. In resetting the bit line in this case, boosted ground voltage Vbsg is supplied to substrate bias line 77 for rapidly resetting the selected bit line to the level of intermediate voltage Vma.

During the reset period, the power supply control is performed for global power source lines 71 and 73 so as to set global power source lines 71 and 73 to the high impedance state. After this reset period, substrate bias lines 75 and 77 are driven to the levels of the boosted voltage and the negative voltage, respectively. The driving of these power source voltages may be performed after expiration of the reset period. FIG. 11 represents an operation manner, in which the voltage levels of the respective power source lines are adjusted after completion of the data writing.

Therefore, in causing the current to flow through the bit line in the data write operation, MOS transistors PBL, PBR, NBL and NBR in the bit line drivers provided for the selected bit line have the back gate biases made shallow, and have the threshold voltages decreased in absolute value, and the current driving powers increased. Global power source lines 71 and 73 are supplied with power supply voltage VCC and ground voltage GND, respectively. By adjusting the back gate bias as described above, bit line drivers BLLVa to BLLVc and BLRVa to BLRVc have large driving powers, and it is possible to achieve the bit line drivers, which can drive the bit lines by the large driving powers, without increasing the occupation area.

During the standby, the high-side and low-side power supply lines are set to the high impedance state, to set the gate and source of each MOS transistor in the bit line driver in the reverse-biased state. The back gate bias is accordingly made deep so that the leakage current is sufficiently suppressed, and the current consumption during the standby is reduced.

Figure 12:
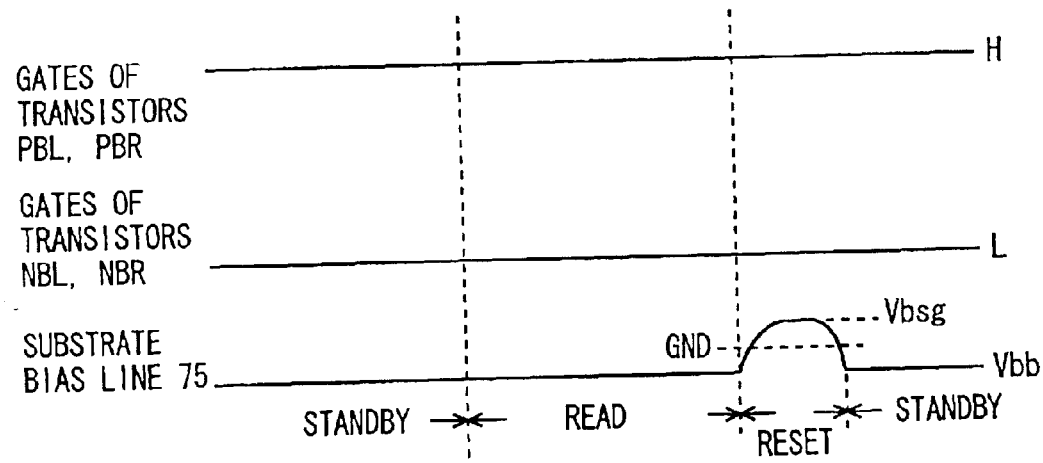
FIG. 12 is a signal waveform diagram representing an operation in data reading of the bit line drive circuit shown in FIG. 10.

FIG. 12 is a signal waveform diagram representing the operation in data reading of the bit line drive circuit shown in FIG. 10. In data reading, P-channel MOS transistors PBL and PBR in the bit line driver are kept non-conductive by the signals at H level applied to their gates. MOS transistors NBL and NBR in the bit line driver are kept non-conductive by the signals at L level applied on their gates, respectively. In the data read operation, bit line drivers BLLVa to BLLVc and BLRVa to BLRVc are set to the output high impedance state. Bit line precharge transistors PTa to PTc are likewise set to the non-conductive state during the data reading. The sense power supply supplies the sense current to the selected bit line via the read select circuit shown in FIG. 2.

When the read cycle is completed, the voltage level of substrate bias line 75 is kept at boosted ground voltage Vbsg raised from negative voltage Vbb for a predetermined period, and the selected bit line is rapidly discharged. After the resetting of the bit line is completed, return to the standby state is made, and each bit line is maintained at the intermediate voltage level.

In this data read mode, N-channel MOS transistors NBL and NBR are supplied, on their back gates, with negative voltage Vbb from negative potential generating circuit 88 via substrate bias line 75. MOS transistors PBL and PBR are supplied, on their back gates, with the boosted voltage from boosted potential generating circuit 86.

Boosted potential generating circuit 86 and negative potential generating circuit 88 are formed of circuits utilizing charge pump operations of capacitors, for example. Each of down-converted potential generating circuit 87 and boosted ground generating circuit 89 is formed of a level shift circuit using a resistance element, a circuit generating a signal at the same level as a reference voltage level in accordance with comparison with the reference voltage or a circuit utilizing a level shift action of the diode.

Boosted potential generating circuit 86, down-converted potential generating circuit 87, negative potential generating circuit 88 and boosted ground generating circuit 89 are supplied with test mode instructing signals TEST3, TEST4, TEST5 and TEST6, respectively, and stop the operations during the test mode so that the voltage level of these internal voltages can be externally set via pads 90, 91, 92 and 93, respectively. Therefore, these voltage levels can be optimized, and the voltages produced by ground potential generating circuit 87 and boosted ground generating circuit 89 can be tuned in accordance with the results of this optimization. This applies also to negative potential generating circuit 88 and boosted potential generating circuit 86.

The power supply node and ground node, which are connected to power source transistors 80 and 81, respectively, are isolated from peripheral circuits, and power source transistors 80 and 81 have the sizes adjusted in the test mode so as to supply currents of optimum magnitudes to bit lines from the power supply node and the ground node.

As for the power source control on the bit line drive circuit, in the construction to restore the data, if power source voltage and substrate bias potential can be fully switched, the power source and the substrate bias may be controlled in accordance with actual data writing.

Alternatively, the power source and the substrate bias of the bit line drive circuits may be controlled in accordance with active cycle instructing signal ZACT.

Figure 13:
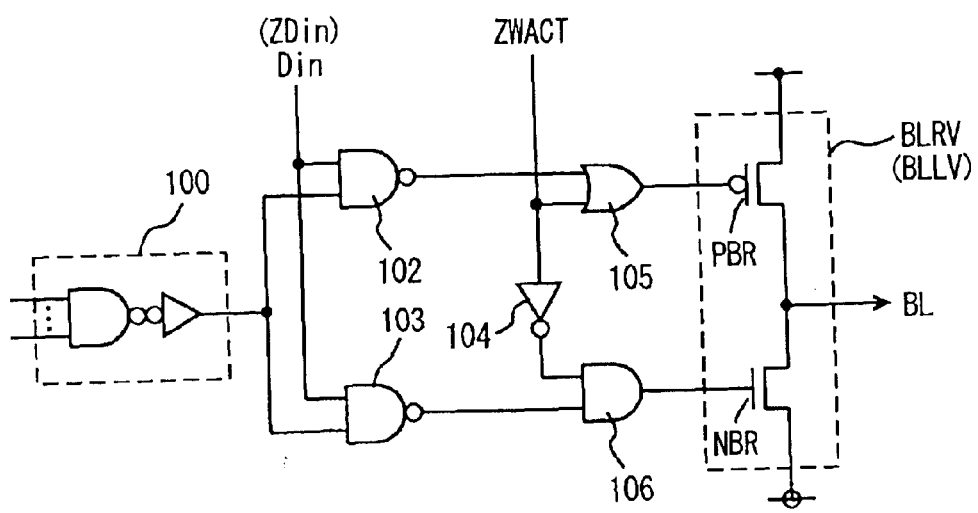
FIG. 13 shows, by way of example, a construction of a tristate decoder shown in FIG. 10.

FIG. 13 shows an example of the constructions of tristate decoders BLDKa to BLDKc and BRDKa to BRDKc. FIG. 13 shows a construction of tristate decoder BRDK (one of decoders BRDKa to BRDKc). In FIG. 13, tristate decoder BRDK includes an AND-type decoder 100 receiving an address signal, a NAND gate 102 receiving an output signal of decoder 100 and internal write data Din, an NAND gate 103 receiving an output signal of the decoder 100 and write data Din, an inverter 104 inverting an write timing signal ZWACT, an OR gate 105 receiving an output signal of NAND gate 102 and write timing signal ZWACT, and an AND gate 106 receiving the output signals of NAND gate 103 and inverter 104.

The output signal of OR gate 105 is applied to the gate of MOS transistor PBR included in bit line driver BLRV, and the output signal of AND gate 106 is applied to the gate of MOS transistor NBR included in bit line driver BLRV.

During the standby, write timing signal ZACR is at H level, the output signal of OR gate 105 is at H level, and the output signal of AND gate 106 is at L level. In the bit line driver BLRV, therefore, both MOS transistors PBR and NBR are in a non-conductive state.

AND-type decoder 100 generates a signal at H level when selected, and generates a signal at L level when unselected. When write data Din is "1", NAND gates 102 and 013 operate as inverters.

In the data write operation, write timing signal ZACT is activated to attain L level at a predetermined timing. Responsively, OR gate 105 and AND gate 106 operate as a buffer circuit. Therefore, OR gate 105 applies a signal at L level to the selected bit line, and AND gate 106 outputs a signal at L level. In this state, MOS transistor NBR is non-conductive, and MOS transistor PBR is conductive so that bit line BL is driven to the H level.

When write data Din is "0", both NAND gates 102 and 103 output the signals at H level. OR gate 105 outputs a signal at H level, and AND gate 106 generates the output signal at H level. In bit line driver BLRV, therefore, MOS transistor PBR is non-conductive and MOS transistor NBR is conductive so that bit line BL is driven to the ground voltage level.

When data Din is "0", the level of the output signal of this tristate driver is determined independently of the output of the associated decoder. In AND-type decoder 100, therefore, decoding operation is inhibited when write data Din is "0".

For the unselected bit line, the output signal of AND-type decode circuit 100 is at L level. Therefore, the output signals of NAND gates 102 and 103 attain H level. Also, in bit line driver BLRV, MOS transistor PBR is non-conductive, MOS transistor NBR is conductive, and the unselected bit line is maintained at the ground voltage level. In the active cycle, the unselected bit lines are reliably prevented from entering an electrically floating state.

Tristate decoder BRDK provided for bit line driver BLLV is supplied with complementary internal write data ZDin instead of write data Din.

By supplying complementary internal write data ZDin to tristate decoder BRDK instead of write data Din, bit line driver BLRV can be held in the unselected state when write data Din is "0", and is driven in accordance with the output signal of AND-type decoder 100 when write data Din is "1".

By applying an output signal of an AND circuit receiving the output signal of AND-type decoder 100 and read activating signal READ to the read select gates, the column decoder can be used commonly for the data writing and the data reading. In this case, reference data Dref is applied instead of internal write data Din such that restoring operation and writing of data through read modify write after internal data read can be performed easily.

Construction of Word Line Drive Circuit

Figure 14:
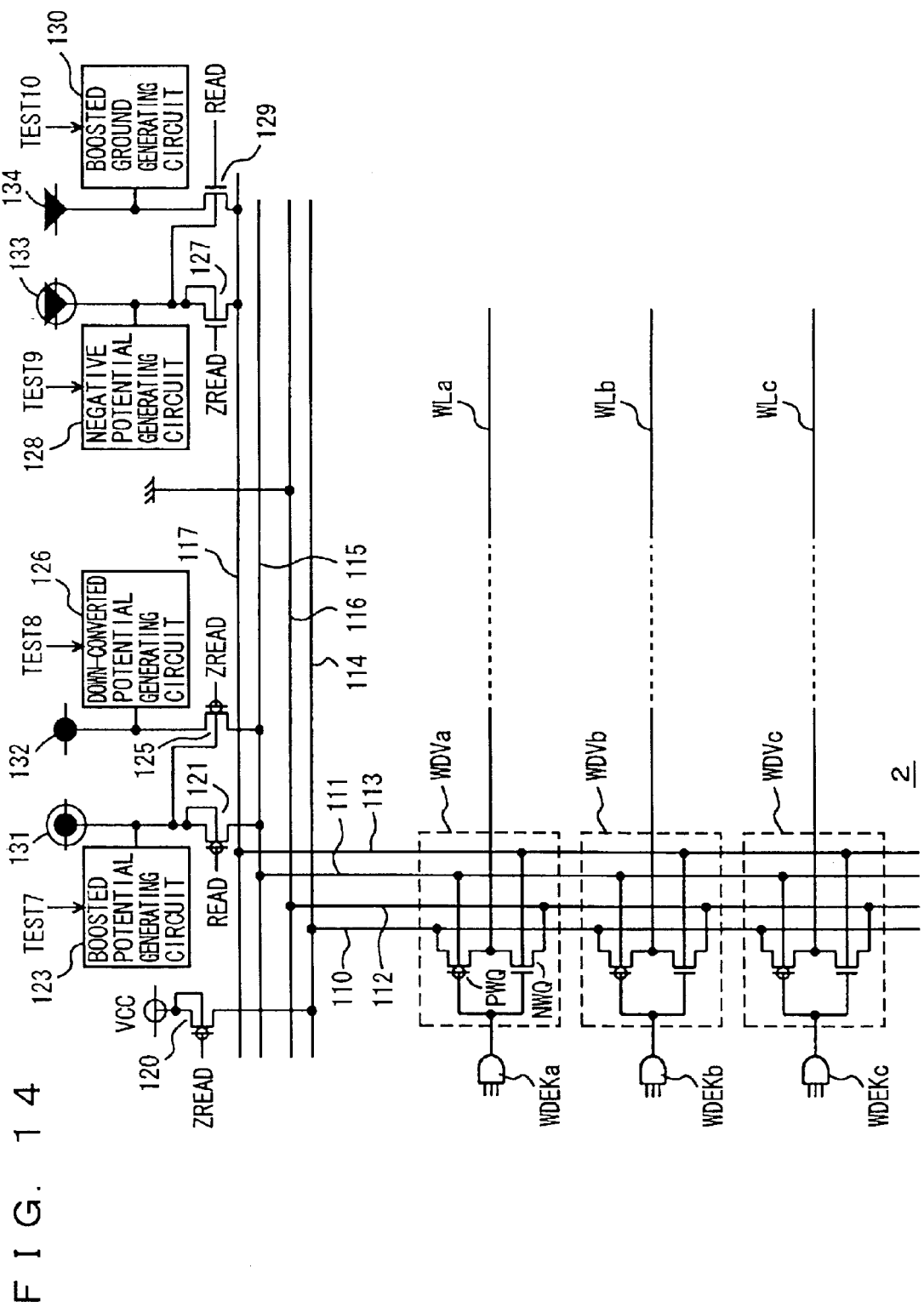
FIG. 14 shows constructions of a word line drive circuit and a power supply portion shown in FIG. 1.

FIG. 14 schematically shows constructions of the word line drive circuit and its power source circuit shown in FIG. 1. FIG. 14 representatively shows word line drivers WDVa to WDVc arranged corresponding to word lines WLa to WLc, respectively. The word line drivers are arranged alternately on the opposite sides of the memory cell array.

Word lines drivers WDVa to WDVc drive corresponding word lines WLa to WLc to the selected state in accordance with output signals of word line decoders WDEKa to WDEKc, respectively. Each of word line drivers WDVa to WDVc includes P- and N-channel MOS transistors PWQ and NWQ. Word line drivers WDVa to WDVc are each formed of a CMOS inverter and drive corresponding word lines WLa to WLc to the H level when the output signals of corresponding word line decoders WDEKa to WDEKc are at L level.

In word line drivers WDVa to WDVc, P-channel MOS transistors PWQ have sources commonly coupled to high-side local power source line 110 and back gates commonly coupled to a local substrate bias line 111. N-channel MOS transistors NWQ have sources commonly coupled to a local power source line 112 and back gates coupled to a local substrate bias line 113.

High-side local power source line 110 is coupled to a high-side global power source line 114, and low-side local power source line 112 is coupled to a low-side global power source line 116. Global power source line 114 is coupled to the power supply node via a power source transistor 120 receiving a complementary read activating signal ZREAD on its gate. Global power source line 116 is coupled to the ground node. Therefore, low-side global power source line 116 is fixed to the level of the ground voltage.

Power source transistor 120 is formed of a P-channel MOS transistor, and is made conductive to couple the power supply node to global power source line 114 in the data read operation mode. The power supply node coupled to power source transistor 120 and the ground node coupled to low-side global power source line 116 are isolated form other peripheral circuits. The operation of the power source circuit in this word line drive circuit can be controlled in accordance with word line selection operation independently of the other circuits.

Local substrate bias lines 111 and 113 are coupled to global substrate bias lines 115 and 117, respectively. Global substrate bias line 115 is coupled to a boosted potential generating circuit 123 via a switching transistor 121, and is coupled to a down-converted potential generating circuit 126 via a switching transistor 125.

Switching transistor 121 is made conductive when read activating signal READ is inactive, and switching transistor 125 is made conductive when read activating signal ZREAD is active. A boosted potential generating circuit 128 produces a voltage higher than power supply voltage VCC, and down-converted potential generating circuit 126 produces a voltage lower than the power supply voltage. Boosted potential generating circuit 123 and down-converted potential generating circuit 126 are supplied with test mode instructing signals TEST7 and TEST8, respectively, and are controlled to be active or inactive individually in the test mode.

In the test mode, the output node of boosted potential generating circuit 123 is coupled to a pad 131, and the output node of down-converted potential generating circuit 126 is coupled to a pad 132. In the test mode, voltages at intended levels can be externally supplied to pads 131 and 132, respectively.

Global substrate bias line 117 is coupled to a negative potential generating circuit 128 via a switching transistor 127, and is also coupled to a boosted ground generating circuit 130 via a switching transistor 129.

Switching transistors 127 and 129 are each formed of an N-channel MOS transistor, and each have a back gate coupled to the output node of negative potential generating circuit 128. Switching transistor 127 is made conductive when a read activating signal ZREAD is inactive, to transmit the negative potential produced by negative potential generating circuit 128. Switching transistor 129 is made conductive when read activating signal READ is active, to transmit the voltage produced by boosted ground generating circuit 130.

Negative potential generating circuit 128 produces a negative voltage lower than the ground potential, and boosted ground generating circuit 130 produces a voltage higher than the ground voltage.

Negative potential generating circuit 128 and boosted ground generating circuit. 130 are supplied with test mode instructing signals TEST9 and TEST10, and are controlled to be active or inactive independently of each other in the test mode. In the test mode, the output nodes of negative potential generating circuit 128 and boosted ground generating circuit 130 are coupled to pads 133 and 134, respectively. In the test mode, negative potential generating circuit 128 and boosted ground generating circuit 130 stop the operations, and tests on the leakage current and others can be performed while externally adjusting the voltage levels of the negative voltage and the boosted ground voltage.

Figure 15:
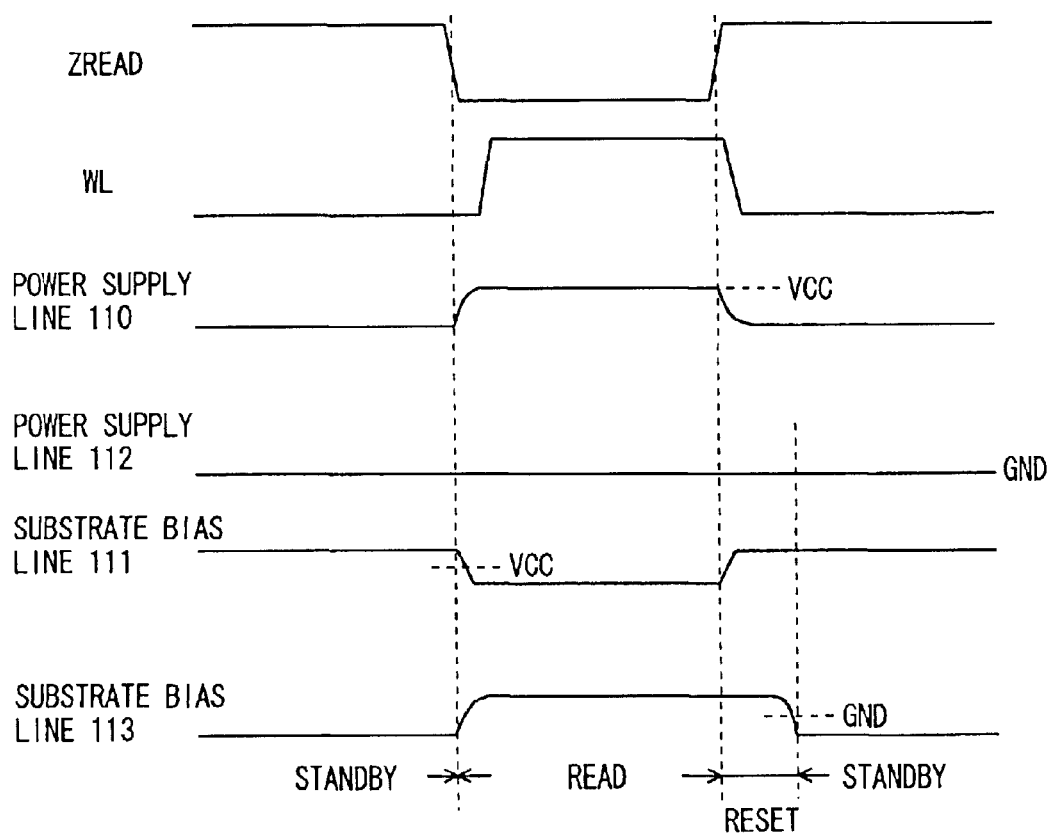
FIG. 15 is a signal waveform diagram representing operations of the circuits shown in FIG. 14.

FIG. 15 is a signal waveform diagram representing an operation of word line drive circuit 2 and the power source circuits shown in FIG. 14. Referring to FIG. 15, the operation of the structures shown in FIG. 14 will now be described.

During the standby, complementary read activating signal ZREAD is at H level, power source transistor 120 is non-conductive and global power source line 114 is isolated from the power supply node.

During the standby, word line decoders WDEKa to WDEKc generate output signals at H level. In each of word line drivers WDVa to WDVc, N-channel MOS transistor NWQ is conductive, and P-channel MOS transistor PWQ is non-conductive.

In this state, a leakage current (subthreshold current) flows through MOS transistor PWQ, and the voltage levels of local power source line 110 and global power source line 114 are stabilized at the voltage level, at which the leakage current flowing through power supply transistor 120 is balanced with and the leakage currents flowing through P-channel MOS transistors PWQ in word line drivers WDVa to WDVc. The gate and source of P-channel MOS transistor PWQ is set in a reverse-biased state in the word line driver, and the leakage current flowing through MOS transistor PWQ is suppressed.

In the above state, switching transistor 121 is conductive, and switching transistor 125 is non-conductive so that substrate bias line 111 is supplied with the boosted voltage produced by boosted potential generating circuit 123. Therefore, the substrate bias of P-channel MOS transistor PWQ becomes deep in each of word line drivers WDVa to WDVc, and the leakage current is reliably suppressed.

In word line drivers WDVa to WDVc, N-channel MOS transistors NWQ are conductive, and word lines WLa to WLc are coupled to low-side global power source line 116 via low-side local power source line 112, respectively. Low-side local power source line 112 and low-side global power source line 116 are at the ground voltage level. In this state, even when word lines WLa to WLc are coupled to the high-side power source line in the floating state, they are fixed at the ground voltage level via N-channel MOS transistors NWQ of the word line drivers because low-side power source lines 112 and 116 are at the ground voltage level.

Further, switching transistor 127 is conductive, and switching transistor 129 is non-conductive so that substrate bias lines 117 and 113 are supplied with negative voltages from negative potential generating circuit 128, and the threshold voltages of N-channel MOS transistors NWQ of word line drivers WDVa to WDVc are increased. In this case, it is possible to suppress reliably the discharging of the leakage current of MOS transistor PWQ to the ground via MOS transistor NWQ.

When data reading starts, complementary read activating signal ZREAD attains L level to turn on power source transistor 120 so that global power source line 114 is supplied with power supply voltage VCC. Switching transistors 125 and 129 are turned on, and switching transistors 121 and 127 are turned off. Responsively, substrate bias lines 115 and 111 are supplied with the down-converted voltage from down-converted potential generating circuit 126, and substrate bias lines 117 and 113 are supplied with the voltage generated by boosted ground generating circuit 130. Responsively, MOS transistors PWQ and NWQ in word line drivers WDVa to WDVc have the substrate biases made shallow, to rapidly drive the word line corresponding to the addressed row.

When the read operation is completed, it is necessary to drive word line WL in the selected state to the unselected state. For this driving, the boosted ground voltage generated by boosted ground generating circuit 130 is transmitted to substrate bias lines 117 and 113 so that discharging MOS transistors NWQ in word line drivers WDVa to WDVc have sufficiently large driving powers. Thus, the word line in the selected sate can be rapidly driven to the unselected state. Then, the power source transistors 127 and 129 are made conductive and non-conductive to transmit the negative potential generated from negative potential generating circuit 128 to the substrate bias lines 113 and 117.

The word line drive circuit is required to drive the word line at L level to the power supply voltage level in the data read operation. It is when the selected word line is driven to the unselected state, for N-channel MOS transistor NWQ to be required to have a large driving power. Accordingly, such a configuration may be employed that boosted ground generating circuit 130 transmits the boosted ground voltage to substrate bias lines 113 and 117 only during the reset period after the data reading.

During standby, as described above, the drive transistor in the word line driver likewise is configured to have the substrate bias made deeper and the power supply line is maintained in the floating state. Therefore, the leakage current can be suppressed in the standby state. In operation, the substrate bias is made shallower, and the word line can be rapidly driven to the selected state by a large driving power. Thus, it is possible to achieve the word line drive circuit, which occupies a small area and has a large driving power, without increasing an area of the drivers.

Construction of Source Line Drive Circuit

Figure 16:
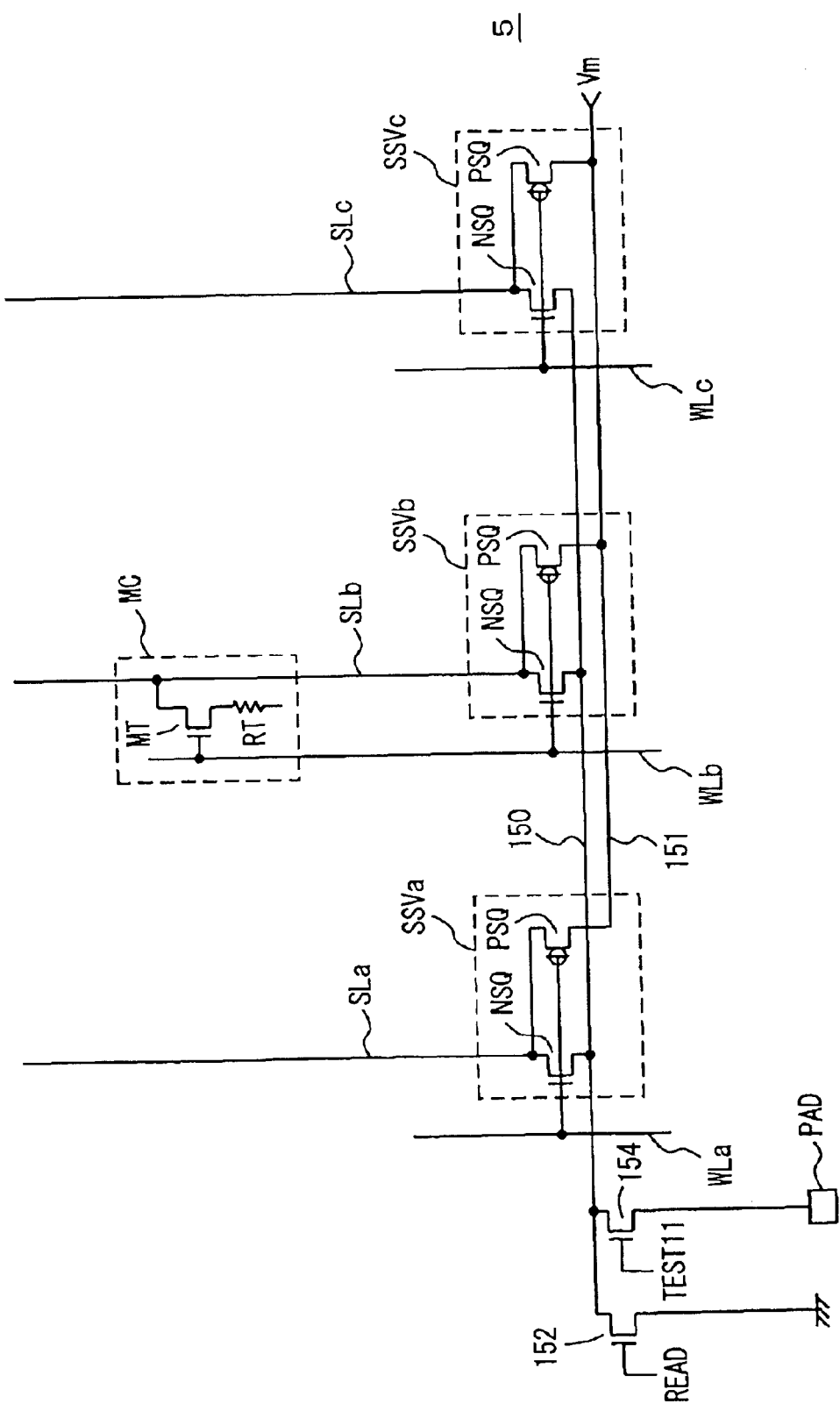
FIG. 16 schematically shows a construction of a source line drive circuit shown in FIG. 1.

FIG. 16 shows a construction of source line drive circuit 5. In source line drive circuit 5, source line drivers are alternately arranged on the opposite sides of the source lines. FIG. 16 shows source line drivers of source line drive circuit 5 arranged on one side. FIG. 16 representatively shows source lines SLa to SLc.

Source line drivers SSVa to SSVc are provided for source lines SLa to SLc, respectively. Each of source line drivers SSVa to SSVc includes N- and P-channel MOS transistors NSQ and PSQ responsive to the signal potential of corresponding word line WLa, WLb or WLc.

N-channel MOS transistor NSQ couples corresponding source line SLa, SLb or SLc to a low-side local source power supply line 150 when conductive. P-channel MOS transistor PSQ couples corresponding source line SLa, SLb or SLc to an intermediate voltage transmission line 151 when conductive. An intermediate voltage Vm on intermediate voltage transmission line 151 is merely required to reverse-bias the gate and source of access transistor MT in memory cell MC, and to be intermediate between power supply voltage VCC and ground voltage GND. Intermediate voltage Vm may be at the same voltage level as precharge voltage Vma on bit line BL.

Low-side local source power supply line 150 is coupled to the ground node via a source power supply transistor 152. Source power supply transistor 152 is made conductive in response to activation of read activating signal READ. Low-side source power supply line 150 is coupled to a pad PAD via a switching transistor 154 in response to a test mode instructing signal TEST11. Switching transistor 154 is formed of an N-channel MOS transistor, and couples the low-side source power supply line 150 to pad PAD when test mode instructing signal TEST11 is at H level. changes the voltage level of the selected source line. Under this state, the voltage level of a selected source line to change the amount of the sense current flowing through the source line and the amount of the leakage current, and the test is performed.

In the standby state, source power supply transistor 152 is non-conductive, and low-side source power supply line 150 is isolated from the ground node. Word lines WLa to WLc are not selected, and P-channel MOS transistors PSQ in source line drivers SSVa to SSVc are conductive so that intermediate voltage Vm is transmitted to source lines SLa to SLc. Even when source lines SLa to SLc are precharged to the level of intermediate voltage Vm, N-channel MOS transistor NSQ in each of source line drivers SSVa to SSVc is non-conductive, and the voltage level of local source power supply line 150 is stabilized at the voltage level, at which the leakage current of MOS transistor NSQ balances the leakage current of source power supply transistor 152.

In this state, the gate and source of the N-channel MOS transistor of source line driver SSV (SSVa to SSVc) are reverse-biased, and a leakage current flowing via MOS transistor NDQ is suppressed.

In the data read operation, read activating signal READ is at H level, source power supply transistor 152 turns conductive, and low-side local source power supply line 150 is coupled to the ground node to keep its voltage level at the ground voltage level. In the source line driver provided corresponding to the selected word line, N-channel MOS transistor NSQ turns conductive, and source line SL for the selected memory cell is driven to the ground voltage level.

For the unselected memory cell, the source line is maintained at the level of intermediate voltage Vm, and the current flowing from the selected bit line via resistance element RT of the unselected memory cell is prevented from leaking via access transistor MT to the unselected source line. Thus, the amount of current flowing from the bit line to the source line in the selected memory can be set to an amount depending on the storage data of the selected memory cell, and the memory cell data can be read accurately.

When the data reading completes, the selected word line is driven to the unselected state, and accordingly, source line driver SSV arranged corresponding to the selected word line has N-channel MOS transistor NSQ turned non-conductive and P-channel MOS transistor PSQ turned conductive. Consequently, the selected source line is precharged to the level of intermediate voltage Vm again. Further, source power supply transistor 152 is turned off, and low-side source power supply line 150 is maintained in the electrically floating state.

In the test mode, test mode instructing signal TEST11 is set to H level, and a voltage at an intended level is applied to pad PAD for adjusting the amount of current flowing through the source line and measuring the amount of leakage current.

As described above, the source line driver is driven in response to the signal on the corresponding word line. Thus, a decode circuit for driving the source line is not required, and an area occupied by the source line drive circuit can be reduced. Further, an unselected source line is precharged to and maintained at the level of intermediate voltage Vm, so that the leakage current of the memory cell can be reduced. By maintaining the source ground line (low-side local source power supply line) in the floating state during standby, the leakage current can be suppressed and accordingly, the standby current can be reduced even when the source line is maintained at the intermediate voltage level during standby.

Whole Arrangement

Figure 17:
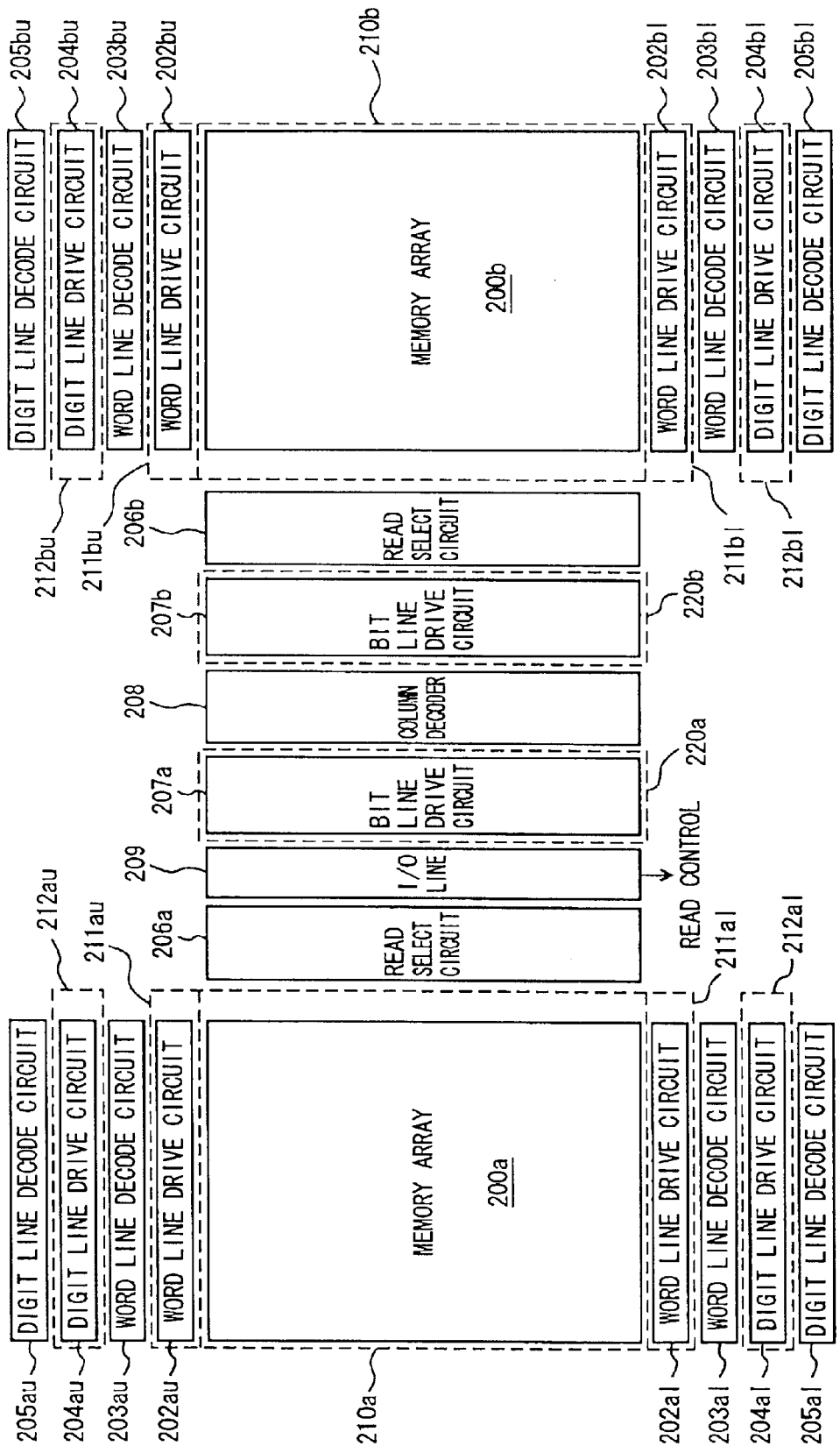
FIG. 17 schematically shows an arrangement of substrate regions of a nonvolatile semiconductor memory device according to the invention.

FIG. 17 schematically shows an arrangement of the substrate region of the nonvolatile semiconductor memory device according to the invention. The semiconductor memory device shown in FIG. 17 includes memory arrays 200a and 200b. Each of memory arrays 200a and 200b includes memory cells arranged in rows and columns. Memory arrays 200a and 200b are formed in array substrate regions 210a and 210b, respectively. Access transistors of the memory cells are formed in array substrate regions 210a and 210b.

Bias voltages of these array substrate regions are individually adjusted. Thereby, even if a noise is generated in substrate regions 210a and 210b, propagation of such noise can be suppressed. By driving memory arrays 200a and 200b individually, it is possible to perform a so-called block division operation (partial activation scheme) for driving only the array including the selected memory cell to the selected state, and the current consumption can be reduced.

On one side of memory array 200a, there are arranged a word line drive circuit 202au, a word line decode circuit 203au, a digit line drive circuit 204au and a digit line decode circuit 205au in this order. Word line drive circuit 202au is formed in a substrate region 211au, and digit line drive circuit 204au is formed in a substrate region 212au.

Likewise, on the other side of memory array 200a, a word line drive circuit 202al is formed in a substrate region 211al, and a digit line drive circuit 204al is formed in a substrate region 212al. A word line decode circuit 203al is formed between word line drive circuit 202al and digit line drive circuit 204al.

In the digit line drive circuit, the digit line driver is formed of a P-channel MOS transistor, and substrate regions 212al and 212au for forming digit line drive circuits 204au and 204al are formed of, e.g., N-well regions, respectively. Word line drive circuits 202au and 202al include P- and N-channel MOS transistors. These P- and N-channel MOS transistors are formed in substrate regions 212au and 212al. This is achieved utilizing, e.g., the twin well structure.

On one side of memory array 200b, there are arranged a word line drive circuit 202bu, a word line decode circuit 203bu, a digit line drive circuit 204bu and a digit line decode circuit 205bu. Word line drive circuit 202bu is formed in substrate region 211bu, and digit line drive circuit 204bu is formed in substrate region 212bu.

On the other side of memory cell 200b, a word line drive circuit 202bl, a word line decode circuit 203bl, a digit line drive circuit 204bl and a digit line decode circuit 205bl are arranged. Word line drive circuit 202bl is formed in substrate region 211bl, and digit line drive circuit 204bl is formed in substrate region 212bl.

Between memory arrays 200a and 200b, there are arranged read select circuits 206a and 206b, bit line drive circuits 207a and 207b, and a column decoder 208. Between read select circuit 206a and bit line drive circuit 207a, there is arranged an internal data line (I/O line), which transmits internal read data to a differential amplifier circuit performing a sense operation in the data read operation.

Bit line drive circuits 207a and 207b are formed in substrate regions 220a and 220b, respectively. Column decoder 208 may be separately provided for data writing and for data reading. Alternatively, column decoder 208 may be configured to perform the decoding operation in both the write and read operations.

According to the arrangement shown in FIG. 17, memory arrays 200a and 200b are provided, and data access is made only to the memory array including a selected memory cell, so that the current consumption can be reduced. Since each of memory arrays 200a and 200b is provided with a circuit for selecting a memory cell, the "block division operation (partial activation operation)" can be achieved.

Word line drive circuits 202au, 202bu, 202al and 202bl are formed in substrate regions 211au, 211bu, 211al and 211bl, respectively, and digit line drive circuits 204au, 204bu, 204al and 204bl are arranged in substrate regions 212au, 212bu, 212al and 212bl, respectively, so that the substrate potentials of these circuits can be individually controlled.

Bit line drive circuits 207a and 207b are formed in substrate regions 220a and 200b, respectively, and are isolated from substrate regions of other circuits.

The substrate biases for the word line drive circuits, digit line drive circuits and bit line drive circuits can be changed at different timings. By setting the substrate bias depending on the operation mode, fast operation can be achieved with low current consumption.

More specifically, during the standby, a negative bias is applied to the substrate regions of these word line drive circuits, digit line drive circuits and bit line drive circuits for reducing the leakage current. When the active cycle starts, the substrate biases of the word line drive circuits, digit line drive circuits and bit line drive circuits are set depending on whether the data reading is instructed or the data writing is instructed. By isolating the substrate region for each circuit, the optimum substrate bias can be set in accordance with each operation mode so that a fast operation and reduced current consumption can be achieved.

In the arrangement shown in FIG. 17, the substrate biases of the word line drive circuits, digit line drive circuits and bit line drive circuits are individually controlled so that the power source lines are individually controlled. Therefore, the power supply nodes and the ground nodes are provided individually for the respective circuits.

The power source circuit and the substrate bias circuit are arranged corresponding to each of the word line drive circuit, bit line drive circuit and digit line drive circuit. The power source circuits arranged for the global power source line may be arranged within a predetermined region concentrately. For achieving the block division operation (partial activation operation), however, the power source circuits and the substrate bias circuits must be arranged for each of memory arrays 200a and 200b, and must be controlled individually and separately from those for the other memory array.

Second Arrangement of Substrate Region

Figure 18:
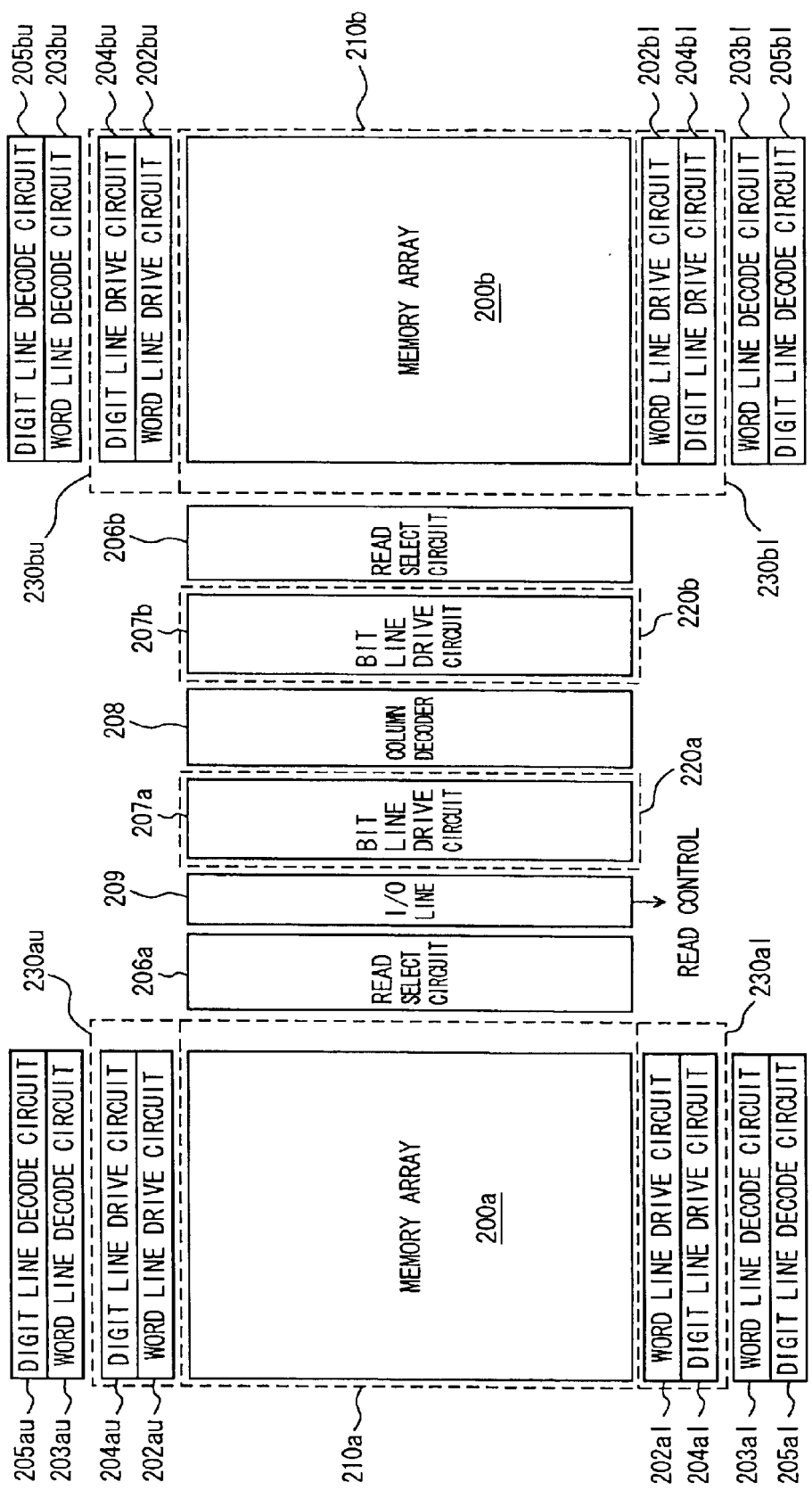
FIG. 18 schematically shows a modification of arrangement of the substrate regions of the nonvolatile semiconductor memory device according to the invention.

FIG. 18 shows a modification of the arrangement of the substrate regions of the nonvolatile semiconductor memory device according to the present invention. Referring to FIG. 18, two memory arrays 200a and 200b are provided, and are formed in array substrate regions 210a and 210b, respectively. For memory array 200a, word line drive circuits, digit line drive circuits, word line decode circuits and digit line decode circuits are arranged. For memory array 200b, word line drive circuits, digit line drive circuits, word line decode circuits and digit line decode circuits are likewise arranged. Circuits for selecting a memory cell and circuitry related to the data reading, arranged for memory arrays 200a and 200b, have the same constructions as those shown in FIG. 17. Corresponding portions are allotted with the same reference numerals, and detailed description thereof is not repeated.

The nonvolatile semiconductor memory device shown in FIG. 18 differs in construction from the nonvolatile semiconductor memory device shown in FIG. 17 in the following points. In the nonvolatile semiconductor memory device shown in FIG. 18, word line drive circuit 202au and digit line drive circuit 204au are commonly formed in a substrate region 230au, and word line drive circuit 202al and digit line drive circuit 204al are commonly formed in a substrate region 230al. Digit line drive circuit 204bu and word line drive circuit 202bu are formed in substrate region 230bu, and word line drive circuit 202bl and digit line drive circuit 204bl are commonly formed in a substrate region 230bl.

Therefore, the drive circuits for the word lines and digit lines are arranged in the common circuit substrate regions. Substrate regions 230au, 230al, 230bu and 230bl each include a substrate region for forming P-channel MOS transistors and a substrate region for forming N-channel MOS transistors.

The digit line decode circuit and the word line decode circuit are arranged outside these substrate regions described above.

Structures of the portions related to the column selection and data reading are the same as those shown in FIG. 17.

According to the arrangement of the substrate regions shown in FIG. 18, the digit line drive circuit and word line drive circuit are formed in the common substrate region. Therefore, it is not necessary to provide a well isolation region for isolating the substrate region of the word line drive circuit from that of the digit line drive circuit, and the layout area of the circuitry can be reduced. Substrate regions 230au, 230al, 230bu and 230bl are set to a negatively biased state (reverse-biased state) in the standby state, and are set to a positively biased state (forward-biased state) in the active cycles for performing writing or reading of data.

Accordingly, the back gate biases of the digit line drive circuit and word line drive circuit are changed at the same timing. In executing the writing and reading of data in a random sequence, the substrate regions of both the digit line drive circuit and the word line drive circuit are required to be set to the positively biased state. When the substrate bias is changed in accordance with the write and read cycles, a response delay may occur. In this situation, the substrate biases can be stably set by changing the substrate bias of the digit line drive circuit and word line drive circuit in accordance with the standby and active cycles.

Third Construction of Substrate Region

Figure 19:
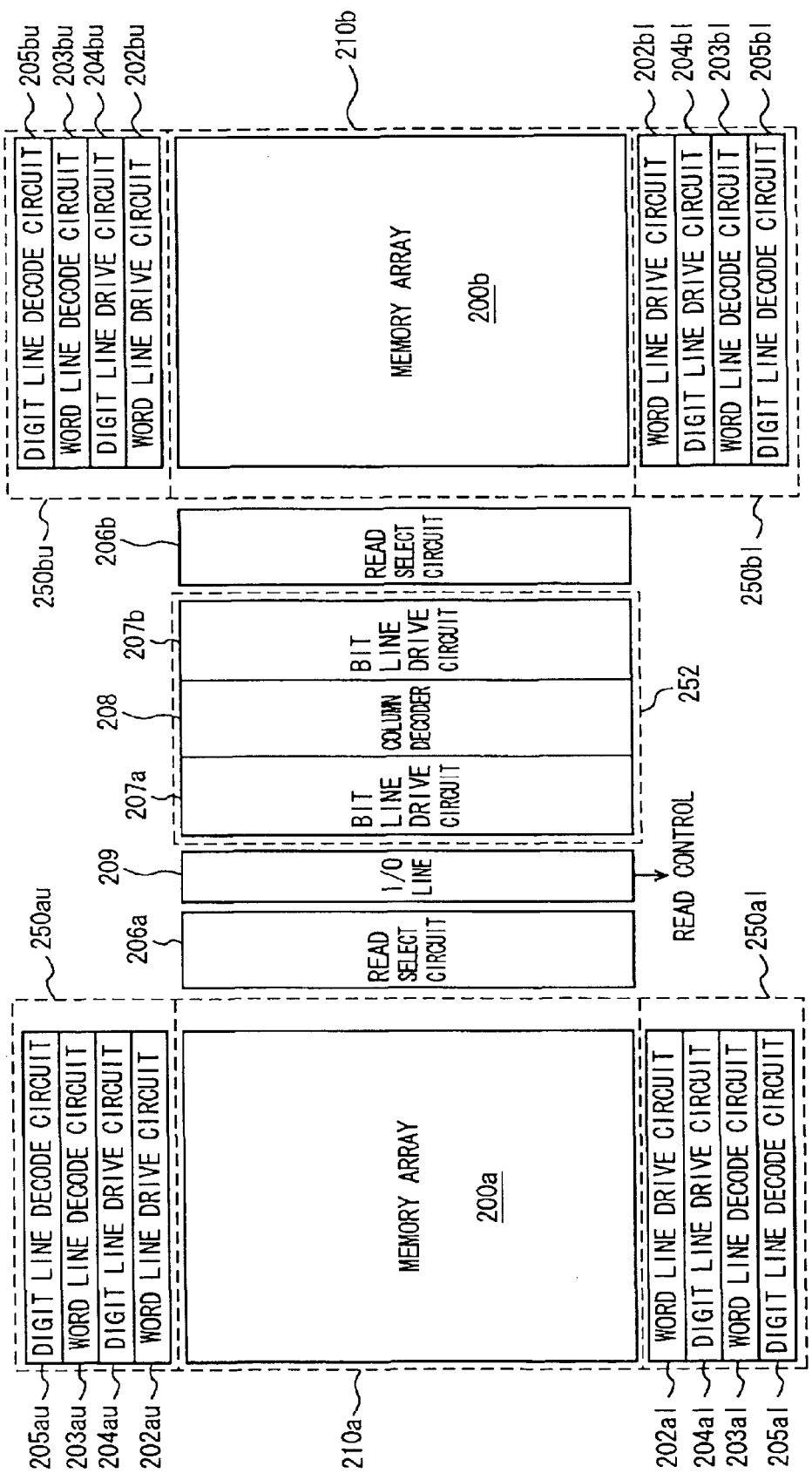
FIG. 19 schematically shows another modification of arrangement of the substrate regions of the nonvolatile semiconductor memory device according to the invention.
Figure 20:
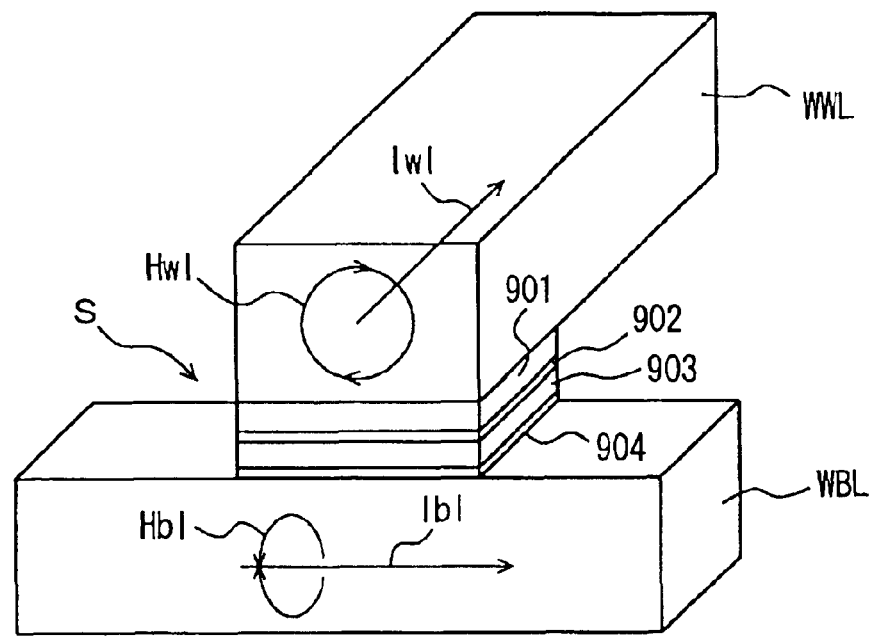
FIG. 20 schematically shows a construction of a conventional magnetic memory element.
Figure 21:
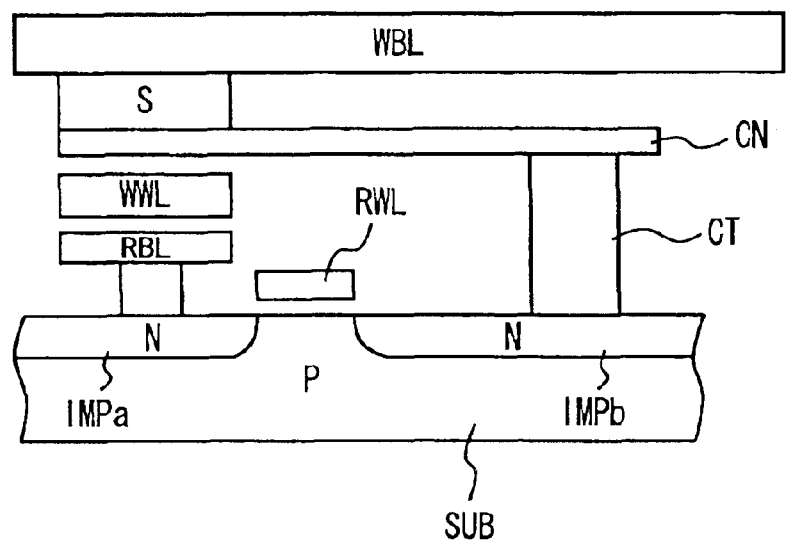
FIG. 21 schematically shows, by way of example, a sectional structure of the conventional magnetic memory element.
Figure 22:
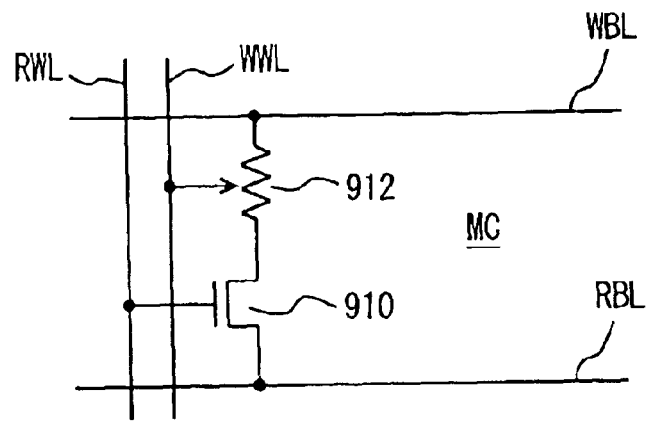
FIG. 22 shows an electrically equivalent circuit of the conventional magnetic memory cell.
Figure 23:
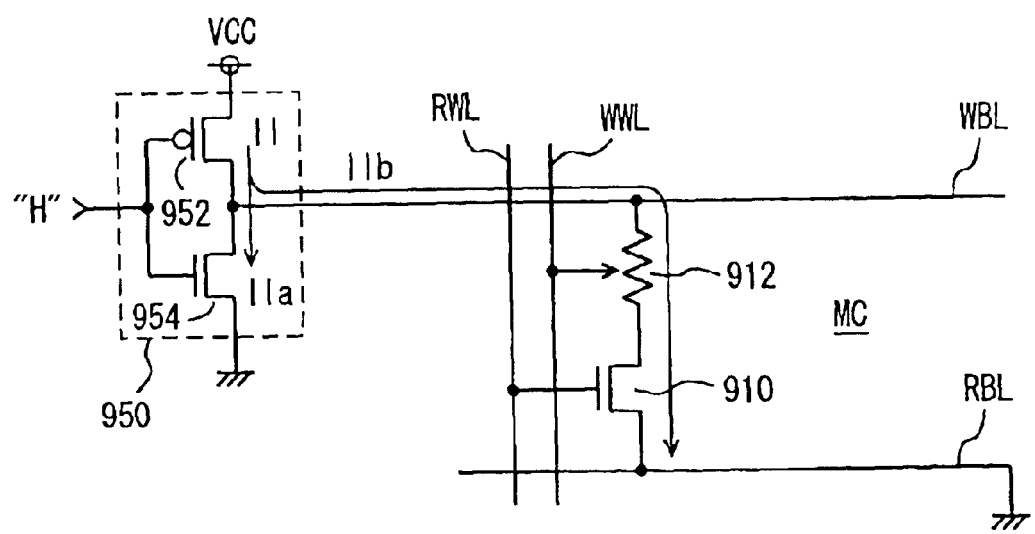
FIG. 23 illustrates a problem of the conventional magnetic memory cell.

FIG. 19 shows still another arrangement of the substrate regions of the nonvolatile semiconductor memory device according to the present invention. The circuit constructions are the same as those of the semiconductor memory devices shown in FIGS. 17 and 18. The corresponding portions are allotted with the same reference numerals, and detailed description thereof is not repeated.

According to the arrangement of the nonvolatile semiconductor memory device shown in FIG. 19, memory arrays 200a and 200b are formed in array substrate regions 210a and 210b, respectively. Word line drive circuit 200au, digit line drive circuit 204au, word line decode circuit 203au and digit line decode circuit 205au are formed in substrate region 250au. Word line drive circuit 202al, digit line drive circuit 204al, word line decode circuit 203al and digit line decode circuit 205al are formed in substrate region 250al.

Word line drive circuit 202bu, digit line drive circuit 204bu, word line decode circuit 203bu and digit line decode circuit 205bu are formed in substrate region 250bu. Word line drive circuit 202bl, digit line drive circuit 204bl, word line decode circuit 203bl and digit line decode circuit 205bl are formed in substrate region 250bl.

Further, bit line drive circuits 207a and 207b as well as column decoder 208 are formed in a substrate region 252. Read select circuits 206a and 206b are formed outside substrate region 252.

In the structure shown in FIG. 19, a decode circuit portion for executing a decoding and a drive circuit for driving a signal line in accordance with the output signal of this decode circuit are arranged in the same substrate region, and the substrate bias potential thereof is controlled in accordance with the standby and active cycles. It is not necessary to provide a region for isolating the substrate regions of the decode circuit and the drive circuit from each other so that the layout area can be further reduced.

Further, the potentials of substrate regions of the digit line decode circuit and word line decode circuit can be controlled as in the digit line drive circuit and word line drive circuit, so that it is possible to reduce the current consumption of digit line decode circuits 205au, 205bu, 205al and 205bl as well as word line decode circuits 203au, 203al, 203bu and 203bl.

Since bit line drive circuits 207a and 207b correspond to different memory arrays, respectively, bit line drive circuits 207a and 207b needs to operate individually and separately from each other so that the substrate regions of bit line drive circuits 207a and 207b are isolated from each other. As to column decoders 208, the bit line drive circuit for one of the memory arrays is active while the bit line drive circuit for the other memory cell is inactive. Therefore, the substrate regions of these bit line drive circuits 207a and 207b and column decoder 208 are arranged separately from each other in the same substrate region 252.

In the active cycle, the digit line decode circuit, word line decode circuit and column decoder have increased current driving powers so that the selecting operation can be performed fast.

In the constructions shown in FIGS. 17 to 19, the bit line drive circuits are arranged on the opposite sides of each memory array, and a selected bit line in each of memory arrays 200a and 200b is driven from both the opposite sides.

As described above, the substrate bias of each circuit is changed in accordance with the operation mode. Thus, the current consumption can be reduced during the standby, and the current driving power in the active cycle can be increased so that the semiconductor memory device operating fast with low current consumption can be achieved.

Other Examples of Application

According to the foregoing description, in the memory cell data read operation, reference data is written, and then is compared with data read from the selected memory cell for determining the memory cell data. However, the constructions of the power supply and the substrate bias can be applied to the construction, in which a dummy cell is arranged in a memory cell array, and data of this dummy cell is compared with data from a selected memory cell.

The description has been given on the nonvolatile semiconductor memory device, in which induced magnetic fields cause polarization in the storage portion of the memory cell for nonvolatilely storing the data in accordance with the direction of polarization. However, the nonvolatile semiconductor memory device is not restricted to such MRAM, and the present invention can be applied, for example, to a nonvolatile semiconductor memory device, in which a phase of a storage material is changed between a crystalline state and an amorphous state for nonvolatilely storing data. For example, such device may be a phase change memory such as an OUM (Ovonics Unified Memory) disclosed in NIKKEI MICROD DEVICES, March 2002, pp. 65 to 78, "Forefront of Nonvolatile Memory; The Future in Intel's Mind: From Flash Memory to "OUM"".

In such a phase change memory as OUM, a memory cell is formed of a thin film of chalcogenide layer and a heating element, and the chalcogenide layer changes into an amorphous state or a crystalline state in accordance with a heat pattern of the heating element conducting a data write current. The chalcogenide layer has a variable electric resistance depending on the amorphous state and the crystalline state. By setting the write current in accordance with the write data, the state of the chalcogenide layer can be determined, and thereby the data can be stored nonvolatilely.

Further, the memory cell is not restricted to the nonvolatile memory cell, and the present invention can be applied to any structure of the memory cell. Under present circumstances, since the selecting current is utilized for selecting a memory cell in the present invention, the present invention can be applied most suitably to a nonvolatile semiconductor memory device, in which polarization is caused in the memory cell by a magnetic fields for nonvolatilely storing the state of polarization, and a nonvolatile semiconductor memory device, in which phase transition is caused by heat from a heating element having a data write current flowing therethrough, and a state of the phase is nonvolatilely stored. However, as for such a memory cell storing data by holding electric charges in a capacitor and performing reading and writing of storage data through a select transistor, the present invention can also be applied to speed up driving of the activation signal line (word line) of the select transistor.

In the MRAM, the access transistor is formed of the N-channel MOS transistor in the above description. However, the present invention can be similarly applied to a construction, in which the access transistor is formed of a P-channel MOS transistor.

According to the invention, as described above, the current consumption during standby can be significantly reduced without lowering the driving power in operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of memory cells each having an internal state determined in accordance with storage data and holding said internal state for storing the data;
   signal line drive circuitry for driving a signal line connected to a selected memory cell in accordance with at least an address signal in a mode of selecting a memory cell; and
   power source circuitry coupled to a power supply node of said signal line drive circuit for supplying a power source voltage to said signal line drive circuitry, said power source circuitry changing a voltage applied to said power supply node in accordance with an operation mode, wherein
   said power source circuitry sets said power supply node to a high impedance state when said signal line drive circuitry is inactive, and supplies a voltage at a predetermined voltage level to said power supply node when said signal line drive circuitry is active.

2. A nonvolatile semiconductor memory device comprising:
   a plurality of memory cells each having an internal state determined in accordance with storage data and holding said internal state for storing the data;
   signal line drive circuitry for driving a signal line connected to a selected memory cell in accordance with at least an address signal in a mode of selecting a memory cell; and
   power source circuitry coupled to a power supply node of said signal line drive circuit for supplying a power source voltage to said signal line drive circuitry, said power source circuitry changing a voltage applied to said power supply node in accordance with an operation mode, wherein
   said plurality of memory cells are arranged in rows and columns, and each memory cell includes a resistance element having a resistance value determined in accordance with storage data and storing the data by the resistance value;
   said semiconductor memory device further comprises a plurality of bit lines, arranged corresponding to memory cell columns, each coupled to the resistance elements of the memory cells on a corresponding column, each bit line corresponding to the signal line; and
   said signal line drive circuitry includes bit line drive circuits, arranged corresponding to the bit lines, each for supplying a current to the corresponding bit line when activated.

3. The nonvolatile semiconductor memory device according to claim 2, further comprising:
   a voltage holding circuit coupled to the bit lines for maintaining each bit line at a predetermined voltage level when said bit line drive circuits are inactive.

4. A nonvolatile semiconductor memory device comprising:
   a plurality of memory cells each having an internal state determined in accordance with storage data and holding said internal state for storing the data;
   signal line drive circuitry for driving a signal line connected to a selected memory cell in accordance with at least an address signal in a mode of selecting a memory cell; and
   power source circuitry coupled to a power supply node of said signal line drive circuit for supplying a power source voltage to said signal line drive circuitry, said power source circuitry changing a voltage applied to said power supply node in accordance with an operation mode, wherein
   said plurality of memory cells are arranged in rows and columns, and each memory cell includes a resistance element having a resistance value determined in accordance with the storage data and an access transistor coupled to said resistance element;
   said semiconductor memory device further comprises a plurality of word lines, arranged corresponding to the rows of the memory cells, each coupled to the access transistors of the memory cells on a corresponding row, each word line corresponding to the signal line; and
   said signal line drive circuitry includes word line drive circuits, arranged corresponding to the respective word lines, each, when activated, for driving a corresponding word line to a selected state for rendering the access transistors in the corresponding memory cells conductive.

5. A nonvolatile semiconductor memory device comprising:
   a plurality of memory cells each having an internal state determined in accordance with storage data and holding said internal state for storing the data;
   signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said plurality of memory cells are arranged in rows and columns, and each memory cell includes a resistance element having a resistance value determined in accordance with the storage data and an access transistor coupled to said resistance element;

said semiconductor memory device further comprises a plurality of source lines, arranged corresponding to the rows of the memory cells, each coupled to the access transistors of the memory cells on a corresponding row, each source line corresponding to the signal line; and said signal line drive circuitry includes a plurality of source line drive circuits, arranged corresponding to the respective source lines, each for driving a corresponding source line to a selected, state to form a path of flowing a current through an associated memory cell when active.

6. The nonvolatile semiconductor memory device according to claim 5, wherein said signal line drive circuitry further includes a plurality of source line reset elements, arranged corresponding to the respective source lines, each for supplying a voltage at a level different from a level of the voltage on said power supply node to a corresponding source line when the corresponding source line is in a unselected state.

7. The nonvolatile semiconductor memory device according to claim 6, further comprising:

a plurality of word lines, arranged corresponding to the rows of memory cells, each coupled to the access transistors of the memory cells on a corresponding row for rendering the access transistors of the memory cells on the corresponding row when selected; and the source line driving circuits and the source line reset elements are selectively activated in response to signals on corresponding word lines, and for each source line, the source line drive circuit and the source line reset element are formed of transistors rendered conductive complementarily to each other.

8. A nonvolatile semiconductor memory device comprising:

a plurality of memory cells each having an internal state determined in accordance with storage data and holding said internal state for storing the data; signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said plurality of memory cells are arranged in rows and columns, said signal lines are arranged corresponding to the rows of the memory cells;

said signal line drive circuitry includes a plurality of drive transistors arranged corresponding to the respective rows of the memory cells for coupling electrically said power supply node to the signal lines arranged in the respective rows, each drive transistor having a back gate; and said semiconductor memory device further comprises a substrate bias circuit for applying a voltage to the back gates of the drive transistors, said substrate bias circuit changing a level of the voltage applied to said back gates in accordance with said operation mode.

9. A nonvolatile semiconductor memory device comprising:

a plurality of memory cells each having an internal state determined in accordance with storage data and holding said internal state for storing the data;

signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said plurality of memory cells are arranged in rows and columns; said signal lines are arranged corresponding to the columns of the memory cells;

said signal line drive circuit includes a plurality of drive transistors arranged corresponding to the respective columns of the memory cells, for coupling electrically said power supply node to signal lines arranged in the respective columns, each drive transistor having a back gate; and said semiconductor memory device further comprises a substrate bias circuit for applying a voltage to the back gates of the drive transistors, said substrate bias circuit changing a level of the voltage applied to said back gates in accordance with said operation mode.

10. The nonvolatile semiconductor memory device according to claim 9, wherein said substrate bias circuit applies, to the back gate, a voltage for forwardly biasing a PN junction of said back gate when said signal line drive circuitry is active, and a voltage for reversely biasing said PN junction when said signal line drive circuitry is inactive.

11. A nonvolatile semiconductor memory device comprising:

a plurality of memory cells each having an internal state determined in accordance with storage data and holding said internal state for storing the data;

signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said power source circuitry is isolated from a power source circuit of a peripheral circuit.

12. A nonvolatile semiconductor memory device comprising:

a plurality of memory cells each having an internal state determined in accordance with storage data and holding said internal state for storing the data;

signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said power source circuitry is responsive to a specific operation mode instructing signal, for supplying a voltage at a level different from a voltage level producible in a normal operation mode by said power source circuitry.

13. A nonvolatile semiconductor memory device comprising:

a plurality of memory cells each having an internal state determined in accordance with storage data and holding said internal state for storing the data;

signal line drive circuitry for driving a signal line connected to a selected memory cell in accordance with at least an address signal in a mode of selecting a memory cell; and power source circuitry coupled to a power supply node of said signal line drive circuit for supplying a power source voltage to said signal line drive circuitry, said power source circuitry changing a voltage applied to said power supply node in accordance with an operation mode, wherein said plurality of memory cells are arranged in rows and columns;

said signal line is arranged corresponding to each respective row of the memory cells;

said signal line drive circuit includes a plurality of drive transistors, arranged corresponding to the rows of the memory cells, for coupling electrically said power supply node to the signal lines arranged in the corresponding rows when conductive, each having a back gate; and said semiconductor memory device further comprises a substrate bias circuit for applying a voltage to the back gates of the drive transistors, said substrate bias circuit supplies a voltage at a predetermined voltage level in a normal operation mode, supplies a voltage at a voltage level different from said predetermined voltage level in a specific operation mode different from said normal operation mode, and switches said predetermined voltage level of the voltage transmitted to the back gates between first and second voltage levels in accordance with active and inactive states of said signal line drive circuitry in said normal operation mode.

14. A nonvolatile semiconductor memory device comprising:

a plurality of memory blocks formed at substrate regions isolated from each other, respectively, and each including a plurality of memory cells, the memory cell having an internal state determined depending on storage data, and holding the internal state for storing data; and a plurality of array drive circuits arranged, corresponding to the memory blocks, in substrate regions isolated from the substrate regions of the memory blocks, respectively, and each selectively driving signal lines coupled to memory cells when a memory cell in a corresponding memory block is selected.

15. The nonvolatile semiconductor memory device according to claim 14, wherein said plurality of memory cells are arranged in rows and columns in each of said memory blocks;

each memory cell includes a resistance element having a resistance value determined in accordance with the storage data and storing the data by the resistance value, and an access transistor for selecting said resistance element; and said signal lines include bit lines, arranged corresponding to the columns of the memory cells, each coupled to the resistance elements of the memory cells in a corresponding column.

16. The nonvolatile semiconductor memory device according to claim 14, wherein said plurality of memory cells are arranged in rows and columns in each of said memory blocks;

each of the memory cells includes a resistance element having a resistance value determined in accordance with the storage data, and an access transistor for selecting said resistance element;

said signal lines include:

word lines, arranged corresponding to the rows of the memory cells rows, respectively, each electrically coupling to control electrodes of the access transistors of the memory cells on a corresponding row, and digit lines, arranged corresponding to the rows of the memory cells, respectively, each coupling to the resistance elements of the memory cells on a corresponding row; and each of the array drive circuits includes a word line drive circuit for driving the word lines in a corresponding memory block, and a digit line drive circuit for driving the digit lines in the corresponding memory block, said word line drive circuit and said digit line drive circuit being formed in substrate regions isolated from each other, respectively.

17. The nonvolatile semiconductor memory device according to claim 14, wherein said plurality of memory cells are arranged in rows and columns in each of said memory blocks;

each of the memory cells includes a resistance element having a resistance value determined in accordance with the storage data, and an access transistor for selecting said resistance element;

said signal lines include:

word lines, arranged corresponding to the rows of the memory cells, respectively, each electrically coupling to control electrodes of the access transistors of the memory cells in a corresponding row, and digit lines, arranged corresponding to the rows of the memory cells, respectively, each coupling to the resistance elements of the memory cells in a corresponding row; and each of said array drive circuits includes a word line drive circuit for driving the word lines in a corresponding memory block, and a digit line drive circuit for driving the digit lines in the corresponding memory block, said word line drive circuit and said digit line drive circuit being formed in a common substrate region.

18. The nonvolatile semiconductor memory device according to claim 17, further comprising:

a word line decode circuit for decoding a received address signal to produce and apply a word line designating signal to said word line drive circuit in a data read operation; and a digit line decode circuit being activated in a data write operation to decode a received address signal for producing and applying a digit line designating signal to said digit line drive circuit, said word line decode circuit and said digit line decode circuit being formed in said common substrate, region.

19. A semiconductor device comprising:

a first transistor having an output node connected to a first interconnection line for supplying a current to said first interconnection line when a control electrode of said first transistor is active, and a conduction node;

a substrate potential supply circuit for supplying a potential intermediate between potentials on said output node and said conduction node of said first transistor to a substrate region of said first transistor in a first operation mode; and an isolating circuit for electrically isolating said substrate potential supply circuit and said substrate region from each other in a second operation mode different from said first operation mode.

* * * * *